(12) United States Patent
Takashima et al.

(10) Patent No.: US 6,281,571 B1
(45) Date of Patent: Aug. 28, 2001

(54) SEMICONDUCTOR DEVICE HAVING AN EXTERNAL CONNECTION ELECTRODE EXTENDING THROUGH A THROUGH HOLE FORMED IN A SUBSTRATE

(75) Inventors: Akira Takashima; Fumihiko Ando; Mitsuru Sato; Takashi Suzuki; Yoshikazu Kumagaya; Kazunari Kosakai, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,803

(22) Filed: Mar. 24, 2000

(30) Foreign Application Priority Data

Mar. 26, 1999 (JP) .................................................. 11-084591
Mar. 9, 2000 (JP) .................................................. 12-065536

(51) Int. Cl.$^7$ .................................................. H01L 23/04
(52) U.S. Cl. ........................... 257/698; 257/668; 257/780; 257/747
(58) Field of Search .................................. 257/698, 668, 257/780, 781, 774, 747

(56) References Cited

U.S. PATENT DOCUMENTS

| | | | |
|---|---|---|---|
| 3,868,724 | * | 2/1975 | Perrino . |
| 5,293,067 | * | 3/1994 | Thompson et al. . |
| 5,350,947 | * | 9/1994 | Takekawa et al. . |
| 5,640,047 | * | 6/1997 | Nakashima . |
| 5,668,405 | * | 9/1997 | Yamashita . |
| 5,763,939 | * | 6/1998 | Yamashita . |
| 5,985,695 | * | 11/1999 | Freyman et al. . |
| 6,025,050 | * | 2/2000 | Tsuji et al. . |
| 6,093,970 | * | 7/2000 | Ohsawa et al. . |
| 6,150,615 | * | 11/2000 | Suzuki . |
| 6,198,165 | * | 3/2001 | Yamaji et al. . |

FOREIGN PATENT DOCUMENTS

| | | | |
|---|---|---|---|
| 57-196548 | * | 12/1982 | (JP) . |
| 62-39032 | * | 2/1987 | (JP) . |
| 63-199451 | * | 8/1988 | (JP) . |
| 8-88245 | | 4/1996 | (JP) . |
| 8-97325 | | 4/1996 | (JP) . |
| 10-32280 | | 2/1998 | (JP) . |
| 10-41356 | | 2/1998 | (JP) . |
| 11-126852 | | 5/1999 | (JP) . |
| WO 00/13232 | | 3/2000 | (WO) . |

* cited by examiner

Primary Examiner—Sheila V. Clark
(74) Attorney, Agent, or Firm—Armstrong, Westerman, Hattori, McLeland & Naughton, LLP

(57) ABSTRACT

External connection electrodes can be positively mounted on a substrate when the pitch between the external connection electrodes is reduced and the diameter of each through hole formed in the substrate is reduced. A semiconductor chip is mounted on a first surface of a tape substrate. Electrode films are formed on the first surface of the tape substrate, each of the electrode films electrically connected to the semiconductor chip. External connection electrodes are provided on a second surface of the tape substrate, each of the external connection electrodes connected to a respective one of the electrode films via a through hole formed in the tape substrate. The external connection electrodes are formed on the electrode films by plating. A diameter S1 of a portion of each of the external connection electrodes protruding from the second surface of the tape substrate and a diameter S2 of the through hole satisfy a relationship $S1 \leq S2$.

18 Claims, 22 Drawing Sheets

FIG. 25

|  | COMPARISON SAMPLE 1 | COMPARISON SAMPLE 2 | TEST SAMPLE 1 | TEST SAMPLE 2 | TEST SAMPLE 3 |
|---|---|---|---|---|---|
| PITCH(mm) | 0.5 | 0.5 | 0.5 | 0.5 | 0.5 |
| SUBSTRATE THICKNESS($\mu$m) | 87 | 62 | 62 | 62 | 87 |
| THROUGH HOLE DIAMETER($\mu$m) | 200 | 200 | 225 | 250 | 350 |
| B/A | 0.44 | 0.31 | 0.28 | 0.25 | 0.25 |
| FAULT RATE | 10% | 3% | 0% | 0% | 0% |

FIG. 29

|  | THERMAL EXPANSION RATE [ppm/°C] | COEFFICIENT OF ELASTICITY [GPa] |
|---|---|---|
| Si CHIP | 3.6 | 188 |
| PI | 20 | 3.6 |
| Cu PATTERN | 17.7 | 129 |
| SOLDER BALL | 25.4 | 3.8 |
| MOUNTING BOARD | 17 | 22 |

FIG. 30

| SEMICONDUCTOR DEVICE | | THERMAL EXPANSION RATE [ppm/°C] | GLASS TRANSITION TEMPERATORE [°C] |
|---|---|---|---|
| A | ADHESIVE | 10～16 | 135～145 |
| | SEAL RESIN | 6～10 | 130 |
| B | ADHESIVE | 40～50 | 130～140 |
| | SEAL RESIN | 12～16 | 210 |
| B-IMPROVED | ADHESIVE | 10～20 | 135～145 |
| | SEAL RESIN | 12～16 | 210 |

| | UNIT | | | | |
|---|---|---|---|---|---|
| AMOUNT OF FILLER | [Wt/%] | 50 | 60 | 70 | 80 |
| THERMAL EXPANSION RATE | [ppm/°C] | 40~50 | 30~40 | 20~30 | 10~20 |
| COEFFICIENT OF ELASTICITY | [GPa] | 6~7 | 7~9 | 9~11 | 11~13 |

FIG. 33

| PACKAGE SIZE | SEMICONDUCTOR DEVICE | FAILURE OCCURRING CYCLE |
|---|---|---|
| 10mm□ | A | 1200 |
| | B | 700 |
| | B-IMPROVED | 1000 |
| 14mm□ | A | 900 |
| | B | 400 |
| | B-IMPROVED | 800 |

SEMICONDUCTOR DEVICE HAVING AN EXTERNAL CONNECTION ELECTRODE EXTENDING THROUGH A THROUGH HOLE FORMED IN A SUBSTRATE

BACKGROUND OF THE INVENTION

1. Field of the Invention

The present invention generally relates to semiconductor devices and, more particularly, to a semiconductor device having a substrate provided with an through hole to which a protruding electrode such as a solder ball is provided.

Recently, in association with reduction in the size of semiconductor devices and increase in density of circuits in semiconductor devices, the fine pitch BGA (Ball Grid Array) structure has become widely used for semiconductor devices. A semiconductor device having the fine pitch BGA structure comprises a substrate whose front surface is provided with a semiconductor chip and a resin package molding the semiconductor chip. The back surface of the substrate is provided with solder balls as external connection electrodes.

In order to further reduce the size of the semiconductor device having the fine pitch BGA structure and further increase the density of circuits in the semiconductor device having the fine pitch BGA, the pitch of the solder balls must be further reduced. However, since a high reliability is required for semiconductor devices, a predetermined level of reliability must be maintained even when the pitch of the solder balls is reduced.

2. Description of the Related Art

FIGS. 1 and 2 show parts of semiconductor devices 1A and 1B having a typical fine-pitch ball grid array (FBGA) structure, respectively.

The semiconductor device 1A shown in FIG. 1 is generally referred to as an over molding type BGA. The semiconductor device 1A comprises a substrate 2, a semiconductor chip 3, a plastic package 8 and solder balls 10 (only one shown in the figure).

The substrate 2 is made of a plastic film. The semiconductor chip 3 is mounted on the substrate 2 via an adhesive 4. Through holes 7 are formed at predetermined positions of the substrate 2. Only one through hole 7 is shown in FIG. 1. The opening of the through hole 7 on the surface on which the semiconductor chip 3 is mounted is closed by an electrode film 5 which is formed by copper (Cu) or gold (Au) plating.

A via part 9 is formed inside the through hole 7. The solder ball 10 is bonded to the via part 9. Accordingly, the solder ball 10 is electrically connected to the electrode film 5 via the via part 9. The solder ball 10 protrudes from the surface of the substrate 2 so as to serve as an external connection terminal.

In the over molding type semiconductor device 1A shown in FIG. 1, an electrode of the semiconductor chip 3 is electrically connected to the electrode 5 by a wire 6. The plastic package 8 is formed by, for example, transfer molding so as to protect the semiconductor chip 3, the electrode film 5 and the wire 6.

The semiconductor device 1B shown in FIG. 2 is generally referred to as a flip-chip type FBGA. In FIG. 2, parts that are the same as the parts shown in FIG. 1 are given the same reference numerals, and descriptions thereof will be omitted. Stud bumps 11 are formed on the semiconductor chip 3 (only one stud bump 11 is shown in FIG. 2). The stud bumps 11 may be solder bumps. The semiconductor chip 3 is flip chip bonded to the electrode films 5.

Each of the semiconductor devices 1A and 1B has solder balls 10 as external connection electrodes. Accordingly, the manufacturing process of each of the semiconductor devices 1A and 1B includes a ball mounting process to mount the solder balls 10 onto the substrate 2.

FIGS. 3 through 5 show a method for mounting the solder ball 10 to the substrate 2. It should be noted that FIGS. 3 through 5 show a method for manufacturing the semiconductor device 1A shown in FIG. 1.

In the ball mounting method shown in FIG. 3, an appropriate amount of flux 12 (or solder paste) is previously applied to the solder ball 10, and the solder ball 10 is inserted into the through hole 7 formed in the substrate 2. FIG. 4 shows a state in which the solder ball 10 is inserted into the through hole 7.

Conventionally, a pitch (ball pitch) between the adjacent solder balls is as large as about 0.8 mm. Thus, the diameter L1 of the through hole 7 can be as large as 0.30 mm to 0.40 mm. The diameter R of the solder ball 10 is 0.40 mm to 0.50 mm. Accordingly, when the solder ball 10 is applied to the through hole 7, the entirety of the solder ball 10 is accommodated in the through hole 7 as shown in FIG. 4, or most of the solder ball 10 is accommodated in the through hole 7.

After the solder ball 10 is accommodated in the through hole 7, a solder reflow process (heating process) is performed. Conventionally, since the entirety or most of the solder ball 10 is accommodated in the through hole 7, the melted solder ball 10 positively fills the through hole 7 and is bonded to the electrode film 5. Additionally, excess solder forms the solder ball 10 on the substrate 2 due to a surface tension of the melted solder ball 10. As a result, the semiconductor device 1A shown in FIG. 1 is formed.

On the other hand, in the ball mounting method shown in FIG. 5, an appropriate amount of solder paste 13 is applied to the interior of the through hole 7 according to a screen printing method. As mentioned above, the diameter L1 of the conventional through hole 7 is sufficiently large, therefore an appropriate amount of the solder paste 13 can be easily applied inside the through hole 7. It should be noted that the solder paste 13 is a mixture of the flux made of an organic material and a solder powder.

Thereafter, the solder ball 10 is applied to the through hole 7 in which the solder paste 13 is applied, and a solder reflow process is performed. Thereby, the organic component contained in the solder paste 13 scatters, and the solder powder is melted, which fills the through hole 7. Additionally, the solder ball 10 is also melted and brought into contact with the melted solder in the through hole 7, which results in formation of the semiconductor device 1A shown in FIG. 1.

As mentioned above, the number of terminals provided in a single semiconductor device has been increased due to increase in the density of the semiconductor chips. Additionally, there is a demand for the semiconductor devices to be further reduced in size since the electronic equipment in which the semiconductor devices are incorporated is required to be smaller.

Accordingly, the ball pitch of the solder balls provided in the semiconductor device has become as small as 0.5 mm. In order to achieve the ball pitch of 0.5 mm, the diameter L1 of each through hole must be in the range of 0.20 mm to 0.25 mm. Additionally, the diameter of each solder ball must be about 0.3 mm.

If the ball mounting method mentioned with reference to FIGS. 3 and 4 is used to form the solder balls of the semiconductor device having the above-mentioned small ball pitch, each solder ball cannot be appropriately inserted into the respective through hole 7 since the diameter of the through hole 7 is much smaller than the diameter of the solder ball 10. Accordingly, a large distance remains between the solder ball 10 and the electrode film 5. Thus, even if the solder reflow process is performed, there is a problem in that the solder ball 10 is not electrically connected to the electrode film 5.

FIGS. 6A and 6B show an example in which the ball mounting method mentioned with reference to FIG. 5 is applied to the substrate 2 having a through hole 14 having a diameter of 0.20 mm. When the diameter of the through hole 14 is as small as 0.20 mm to 0.25 mm as shown in FIG. 6A, an appropriate amount of the solder paste 13 cannot be filled into the through hole 14 by using a screen printing method. That is, the solder paste 13 is applied to only a limited area near the opening of the through hole 14.

If the solder reflow process is performed after providing the solder ball 10 to the through hole, the melted solder paste 13 in the through hole 14 is absorbed by the solder ball 10 as shown in FIG. 6B, which results in a state in which solder is not present in the through hole 14. Thus, there is a problem in that the solder ball 10 cannot be appropriately provided to the substrate 2 having the through hole 14 whose diameter L2 is small even if the ball mounting method shown in FIG. 5 is used. Hereinafter, the state in which the electric connection cannot be achieved due to an air gap formed between the solder ball 10 (as an external connection terminal) and the electrode film 5 is referred to as an open fault.

As shown in FIG. 7, if the diameter L3 of the through hole 7 is reduced, the diameter L4 of an electrode pad 16 provided on a mounting board 15 on which the semiconductor device 1A is mounted becomes larger relative to the through hole 7 (L3<L4). Additionally, a solder plating 17 is applied to the electrode pad 16 so as to facilitate the bonding of the solder ball 10 to the electrode pad 16.

When the electrode pad becomes relatively larger than the through hole 7 and when the solder ball 10 and the solder plating layer 17 are melted due to the heat applied during the mounting process, the melted solder ball 10 is attracted by the electrode pad 16. Accordingly, there is a problem in that an air gap is formed in the through hole 7 as shown in FIG. 8, which results in the open fault.

Further, in the conventional semiconductor device 1A, there is a problem in that a crack frequently occurs in the via part 9 as shown in FIG. 9 when the semiconductor device 1A is mounted onto the mounting board 15. It is considered that the crack 19 occurs due to the difference in the thermal expansions between the semiconductor chip 3 and the mounting board 15.

In a semiconductor device using a flexible printed circuitboard (FPC) or TAB tape substrate, it is common for a semiconductor chip to be fixed to the FPC or the TAB tape substrate by an adhesive. In the flip chip type semiconductor device in which the circuit forming surface of the semiconductor chip faces a substrate, an insulating adhesive is used to fix the semiconductor chip to the substrate. That is, the semiconductor chip is fixed to the substrate by applying the insulating adhesive to the tape substrate on which copper (Cu) patterns are formed and curing the insulating adhesive by heating after the semiconductor chip is placed on the tape substrate. In this case, the attachment of the semiconductor chip can be easily and positively performed by managing an amount of the adhesive applied between the semiconductor chip and the tape substrate.

The semiconductor chip is sealed by a sealing resin after being fixed by the adhesive. Since the tape substrate, the circuit patterns, the adhesive, the semiconductor chip and the sealing resin are made of different materials, the thermal expansion rates of these members are different from each other. In the above-mentioned structure of the semiconductor device, these members are made in contact with each other. Accordingly, there are stresses generated between these members due to the differences in the thermal expansion rates. Among these members, the wiring pattern has the smallest mechanical strength. Thus, if the stress due to heat is repeatedly generated in the wiring pattern, a fault such as breakage of the wiring pattern or a fracture of the external terminal may occur.

Consideration is given to a case in which the thermal expansion rate of the adhesive is in the range of 10 to 16 [ppm/° C.] and that of the seal resin is in the range of 6 to 10 [ppm/° C.], where ppm/° C. represents $10 \times 10^{-6}$/° C. These materials generally have a low glass transition temperature (Tg). Specifically, the glass transition temperature of the adhesive is in the range of 135° C. to 145° C. and the glass transition temperature of the seal resin is 130° C. The material having a low glass transition temperature is disadvantageous with respect to prevention of breakage of the wiring pattern. However, since the glass transition temperatures of the above-mentioned materials approximate each other, the thermal stress between these members can be reduced to a certain extent.

It is known that, in normal material, when the temperature of the material exceeds the glass transition temperature, the thermal expansion rate increases to more than three times that when the temperature is below the glass transition temperature. Accordingly, when the higher temperature of a heat cycle of an evaluation test of a semiconductor device is set to a temperature exceeding the glass transition temperature, the thermal stress generated in each member is greatly increased. Thus, the time period to reach the generation of a fault such as the breakage of wire may be extremely reduced. However, since the glass transition temperatures of the members approximate each other, the stress generated in the interface of these members is small.

On the other hand, in a case in which the thermal expansion rate of the adhesive is in the range of 30 to 40 [ppm/° C.] and that of the seal resin is in the range of 12 to 16 [ppm/° C.], the glass transition rate of the seal resin is as high as 210° C. When the glass transition temperature of the seal resin is high, the warping of the semiconductor device can be reduced. However, the difference in the thermal expansion between the adhesive and the seal resin is large, and the glass transition temperatures are also different to a considerable extent, therefore the stress generated in the interface between the adhesive and the seal resin is increased. As a result, the possibility of occurrence of a fault such as breakage of the wiring pattern or a fracture of the external terminal is increased.

SUMMARY OF THE INVENTION

It is a general object of the present invention to provide an improved and useful semiconductor device in which the above-mentioned problems are eliminated.

A more specific object of the present invention is to provide a semiconductor device which enables external connection electrodes being positively mounted on a substrate even when the pitch between the external connection electrodes is reduced and the diameter of each through hole formed in the substrate is reduced.

Another object of the present invention is to provide a semiconductor device which reduces a possibility of breakage of wiring patterns or occurrence of fracture of the external connection terminals due to the difference in thermal expansion rates between the adhesive and the structural components.

In order to achieve the above-mentioned objects, there is provided according to one aspect of the present invention a semiconductor device comprising: a tape substrate having a first surface and a second surface opposite to the first surface; a semiconductor chip mounted on the first surface of the tape substrate; a plurality of electrode films formed on the first surface of the tape substrate, each of the electrode films electrically connected to the semiconductor chip; and a plurality of external connection electrodes provided on the second surface of the tape substrate, each of the external connection electrodes connected to a respective one of the electrode films via a through hole formed in the tape substrate, wherein the external connection electrodes are formed on the electrode films by plating, and a diameter S1 of a portion of each of the external connection electrodes protruding from the second surface of the tape substrate and a diameter S2 of the through hole satisfy a relationship $S1 \leq S2$.

According to the above-mentioned invention, the external connection electrodes are formed by plating without using solder balls. Thus, there is no need to perform a process relating to formation of solder balls on the tape substrate, and the process for forming the external connection electrodes is simplified and a manufacturing cost of the semiconductor device can be reduced.

Additionally, since the diameter S1 of the portion of the external connection electrode protruding from the tape substrate is rendered to be equal to or smaller than the diameter S2 of the through hole ($S1 \leq S2$), a pitch between the adjacent external connection electrodes can be reduced. This allows an increase in the number of external connection electrodes due to a dense structure of the semiconductor chip. It should be noted that the relationship ($S1 \leq S2$) can be achieved by controlling a plating rate and a plating time in the plating process of the external connection electrodes.

Additionally, there is provided according to another aspect of the present invention a semiconductor device comprising: a tape substrate having a first surface and a second surface opposite to the first surface; a semiconductor chip mounted on the first surface of the tape substrate; a plurality of electrode films formed on the first surface of the tape substrate, each of the electrode films electrically connected to the semiconductor chip; and a plurality of external connection electrodes provided on the second surface of the tape substrate, each of the external connection electrodes connected to a respective one of the electrode films via a through hole formed in the tape substrate, wherein each of the external connection electrodes comprises: a first electrode part formed on a respective one of the electrode films, the first electrode part having a height smaller than a depth of the through hole and larger than a half of the depth of the through hole; and a second electrode part connected to the first electrode part within the through hole and having a portion protruding from the through hole.

According to the above-mentioned invention, each of the external connection electrodes comprises the first electrode part and the second electrode part. The first electrode part is formed on a respective one of the electrode films, the first electrode part having a height smaller than a depth of the through hole and larger than a half of the depth of the through hole. The second electrode part is connected to the first electrode part within the through hole and having a portion protruding from the through hole. In the above structure, when the second electrode part is formed, the first electrode part is present within the through hole. Accordingly, by connecting the second electrode part to the first electrode part, the second electrode part can be electrically connected to the electrode film positioned at the end of the through hole.

As mentioned above, since the height of the first electrode part is set so that the first electrode part dose not protrude from the through hole, a distance between the first electrode part and the second electrode part when the first electrode part is formed is small. Accordingly, there is no air gap formed between the second electrode part and the first electrode part when the second electrode part is formed on the first electrode part, and, thereby the second electrode part can be positively connected to the first electrode part and subsequently to the electrode film. Thus, a reliable semiconductor device can be achieved.

Additionally, there is provided according to the another aspect of the present invention a semiconductor device comprising: a tape substrate having a first surface and a second surface opposite to the first surface; a semiconductor chip mounted on the first surface of the tape substrate; a plurality of electrode films formed on the first surface of the tape substrate, each of the electrode films electrically connected to the semiconductor chip; and a plurality of external connection electrodes provided on the second surface of the tape substrate, each of the external connection electrodes connected to a respective one of the electrode films via a through hole formed in the tape substrate, wherein a thin film is formed on an inner surface of the through hole, and the thin film is bondable to a material forming the external connection electrodes.

According to the above-mentioned invention, since the thin film, which is bondable to a material forming the external connection electrodes, is formed on an inner surface of the through hole, no air gap exists between the inner surface of the through hole and the external connection electrode within the through hole. Therefore, a portion of the external connection electrode within the through hole can be prevented from being narrowed. That is, the external connection electrode can be securely bonded to the thin film formed on the inner surface of the thorough hole, which prevents the external connection electrode from being narrowed within the through hole. Accordingly, the external connection electrode is prevented from being broken due to the formation of a narrow portion, and, thus, a reliable semiconductor device can be achieved.

Additionally, there is provided according to another aspect of the present invention a semiconductor device comprising: a tape substrate having a first surface and a second surface opposite to the first surface; a semiconductor chip mounted on the first surface of the tape substrate; a plurality of electrode films formed on the first surface of the tape substrate, each of the electrode films electrically connected to the semiconductor chip; and a plurality of external connection electrodes provided on the second surface of the tape substrate, each of the external connection electrodes connected to a respective one of the electrode films via a through hole formed in the tape substrate, wherein a ratio (B/A) of a thickness B of the tape substrate to a diameter A of the through hole is equal to or smaller than 0.3 ($B/A \leq 0.3$).

According to the above-mentioned invention, the strength of the external connection electrode increases as the diameter A of the through hole increases. The strength of the external connection electrode also increases as the thickness B of the tape substrate decreases. If the diameter A of the through hole is increased irrespective of the thickness B of the tape substrate and the thickness B of the tape substrate is decreased irrespective of the diameter A of the through hole, a semiconductor chip having a dense structure cannot be mounted and the strength of the tape substrate is undesirably reduced. However, according to the present invention, since the ratio (B/A) of the thickness B of the tape substrate to the diameter A of the through hole is equal to or smaller than 0.3 (B/A≦0.3), a sufficient strength can be maintained for both the external connection electrodes and the tape substrate. Thereby, an open fault such as breakage of the external connection electrode can be prevented and a semiconductor chip having a dense structure can be mounted on the tape substrate.

Additionally, there is provided according to the another aspect of the present invention a manufacturing method of a semiconductor device comprising: a substrate having a first surface and a second surface opposite to the first surface; a semiconductor chip mounted on the first surface of the substrate; a plurality of electrode films formed on the first surface of the substrate, each of the electrode films electrically connected to the semiconductor chip; and a plurality of solder balls provided on the second surface of the substrate, each of the solder balls connected to a respective one of the electrode films via a through hole formed in the substrate, an opening of the through hole on the first surface of the substrate being closed by a respective one of the electrode films, the manufacturing method comprising the steps of: applying a solder paste to each through hole of the substrate by a solder printing method so as to fill the solder paste deep inside each through hole so that solder paste contacts the electrode film within each through hole; providing the solder balls to an opening of each through hole on the second surface of the substrate; and heating the solder balls and the solder paste so as to connect each of the solder balls to a respective one of the electrode films.

According to the above-mentioned manufacturing method, a solder paste is provided to each through hole of the substrate by a solder printing method so as to fill the solder paste deep inside each through hole so that solder paste contacts the electrode film within each through hole. Thereby, when the solder ball and the solder paste inside the through hole are joined to each other, there is no air gap formed between the electrode film and the solder paste joined to the solder ball. Thus, occurrence of an open fault is prevented, which results in a reliable semiconductor device being achieved.

Additionally, there is provided according to another aspect of the present invention a semiconductor device comprising: a tape substrate having a first surface and a second surface opposite to the first surface; a semiconductor chip mounted on the first surface of the tape substrate; an adhesive fixing the semiconductor chip to the first surface of the tape substrate; a plurality of electrode films formed on the first surface of the tape substrate, each of the electrode films electrically connected to the semiconductor chip; and a plurality of external connection electrodes provided on the second surface of the tape substrate, each of the external connection electrodes connected to a respective one of the electrode films via a through hole formed in the tape substrate, wherein a thickness of the adhesive between the first surface of the tape substrate and the semiconductor chip is in the range of 100 μm to 150 μm.

According to the above-mentioned invention, the adhesive provided between the tape substrate and the semiconductor chip serves as an absorbing member which reduces a stress concentrated into the external connection electrodes by absorbing the stress generated due to a difference in thermal expansion between the semiconductor chip and the tape substrate. Thus, the external connection electrodes are prevented from being damaged due to the stress caused by the difference in thermal expansion.

Additionally, there is provided according to another aspect of the present invention a manufacturing method of a semiconductor device comprising: a substrate; a semiconductor chip mounted on the substrate; and an adhesive provided between the substrate and the semiconductor chip, the manufacturing method comprising the steps of: applying the adhesive onto the substrate; placing the semiconductor chip on the adhesive; positioning the substrate so that the semiconductor chip is positioned under the substrate with the adhesive therebetween and supported from underneath; and heating the adhesive so as to cure the adhesive.

According to the above-mentioned manufacturing method, when the adhesive provided between the semiconductor chip and the substrate, the semiconductor chip is positioned under the substrate and the semiconductor chip tends to move away from the substrate by its own weight. Thus, by appropriately supporting the semiconductor chip, a predetermined distance can be provided between the semiconductor chip and the substrate. That is, a relatively thick layer of the adhesive can be easily formed between the semiconductor device and the substrate. Such a thick layer of the adhesive can reduce a stress concentrated into wiring patterns on the substrate by absorbing a stress generated due to a difference in thermal expansion between the semiconductor chip and the tape substrate. Thus, the wiring patterns are prevented from being broken due to the stress caused by the difference in thermal expansion.

Additionally, there is provided according to another aspect of the present invention a semiconductor device comprising: a substrate; a semiconductor chip mounted on the substrate; an adhesive fixing the semiconductor chip to the substrate; a plurality of electrode films formed on the substrate, each of the electrode films electrically connected to the semiconductor chip; and a seal resin sealing the semiconductor chip and the electrode films, wherein a thermal expansion rate of the adhesive is greater than a thermal expansion rate of the semiconductor chip and smaller than a thermal expansion rate of the substrate, and the thermal expansion rate of the adhesive is approximated to a thermal expansion rate of the seal resin.

According to the above-mentioned invention, since the difference between the thermal expansion rate of the adhesive and the thermal expansion rates of the component parts contacting the adhesive are rendered to be as small as possible, a stress caused by the difference in thermal expansion between the adhesive and each of the semiconductor device and the substrate can be reduced. Thereby, breakage of the wiring patterns or a fracture of the external connection electrodes due to the difference in thermal expansion between the adhesive and each component part contacting the adhesive can be reduced, and, therefore, a reliable semiconductor device can be achieved.

In one embodiment, the thermal expansion rate of the adhesive is adjusted to an appropriate value by adding filler to the adhesive. That is, the thermal expansion rate of the adhesive is reduced to a value between the thermal expansion rates of the semiconductor chip and the substrate. Particles of silicon oxide ($SiO_2$) are preferably used for the filler.

Other objects, features and advantages of the present invention will become more apparent from the following detailed description when read in conjunction with the accompanying drawings.

BRIEF DESCRIPTION OF THE DRAWINGS

FIG. 25 is an illustration for explaining a result of experiments for evaluating the semiconductor device according to the fourth embodiment of the present invention;

FIG. 29 is an illustration for explaining the thermal expansion rate and the coefficient of elasticity of component parts of the semiconductor device shown in FIG. 28;

FIG. 30 is an illustration for explaining the thermal expansion rate and the glass transition temperature of test samples;

FIG. 33 is an illustration for explaining a result of tests environment acceleration test;

DETAILED DESCRIPTION OF THE PREFERRED EMBODIMENTS

Figure 1:
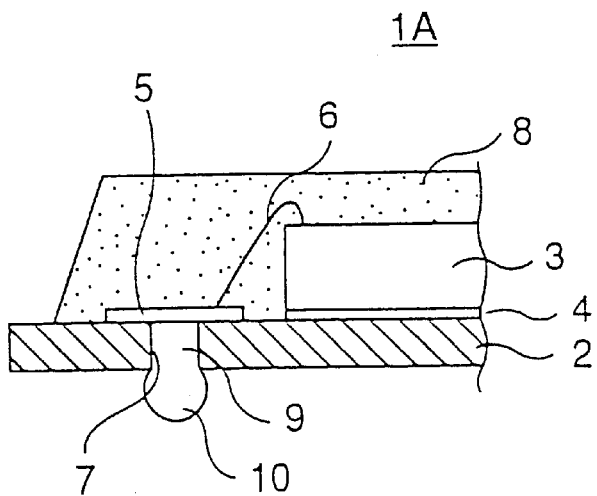
FIG. 1 is a cross-sectional view of a part of a semiconductor device having a conventional FBGA structure.
Figure 2:
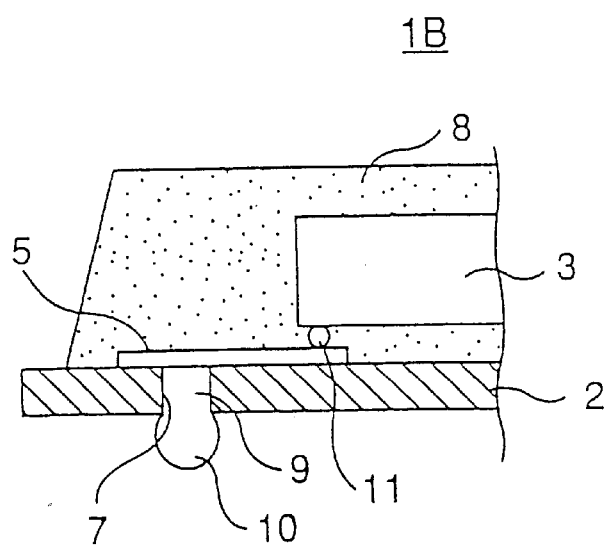
FIG. 2 is a cross-sectional view of a part of another semiconductor device having a conventional FBGA structure.
Figure 3:
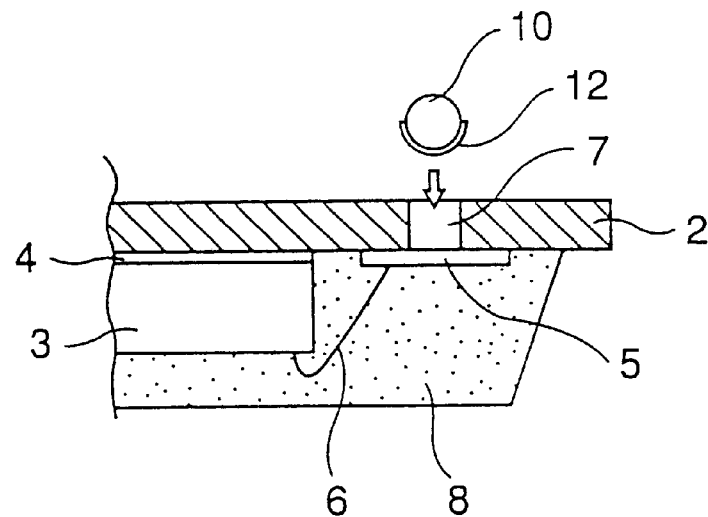
FIG. 3 is a cross-sectional view of the conventional semiconductor device shown in FIG. 1 for explaining a manufacturing method thereof.
Figure 4:
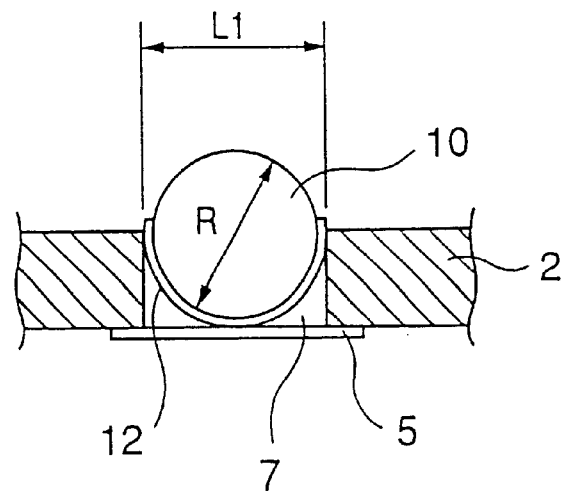
FIG. 4 is an enlarged cross-sectional view of a part provided with a through hole shown in FIG. 1 for explaining the manufacturing method thereof.
Figure 5:
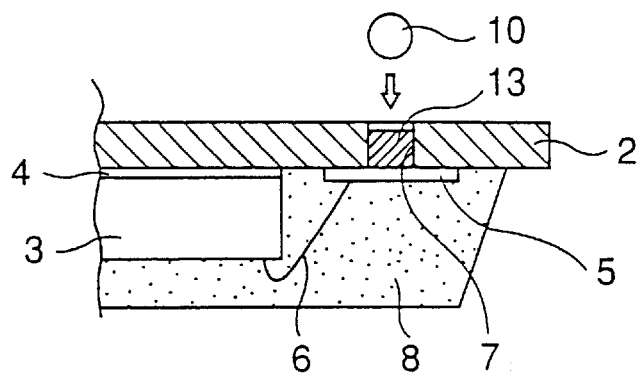
FIG. 5 is a cross-sectional view of a part of the semiconductor device shown in FIG. 1 for explaining the manufacturing method thereof.
Figure 6A:
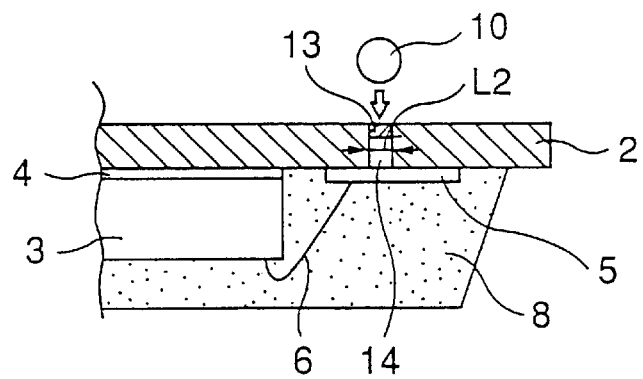
FIGS. 6A and 6B are cross-sectional views of a part of the conventional semiconductor device for explaining a problem in the manufacturing method thereof.
Figure 6B:
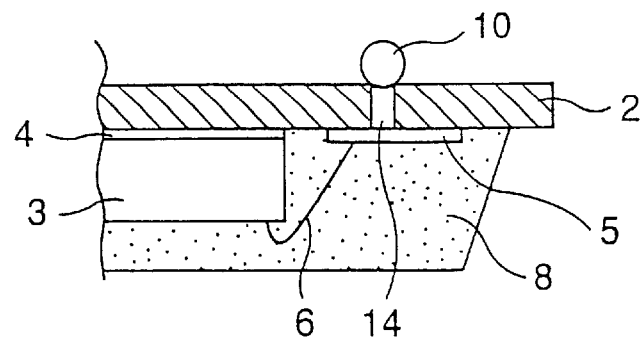
Figure 7:
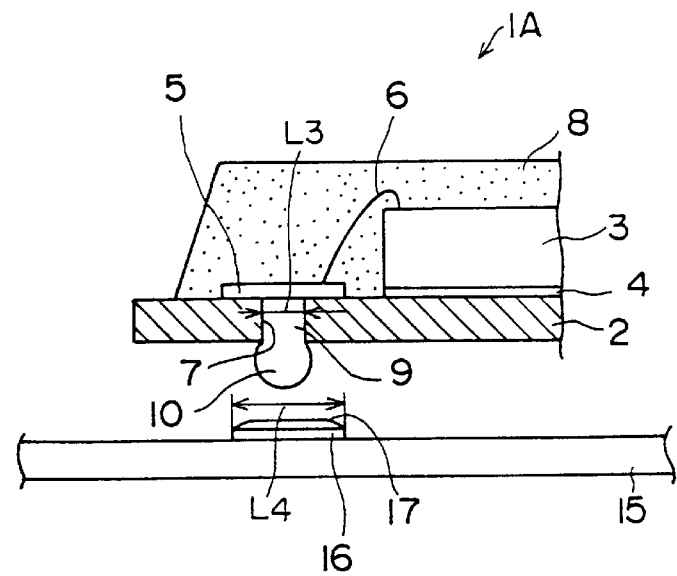
FIG. 7 is a cross-sectional view of a part of the conventional semiconductor device shown in FIG. 1 for explaining a problem in mounting the semiconductor device to a mounting board.
Figure 8:
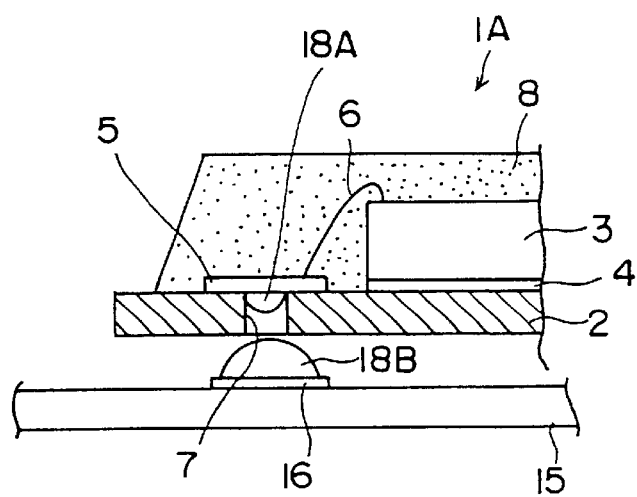
FIG. 8 is a cross-sectional view of a part of the conventional semiconductor device shown in FIG. 1 for explaining the problem in mounting the semiconductor device to the mounting board.
Figure 9:
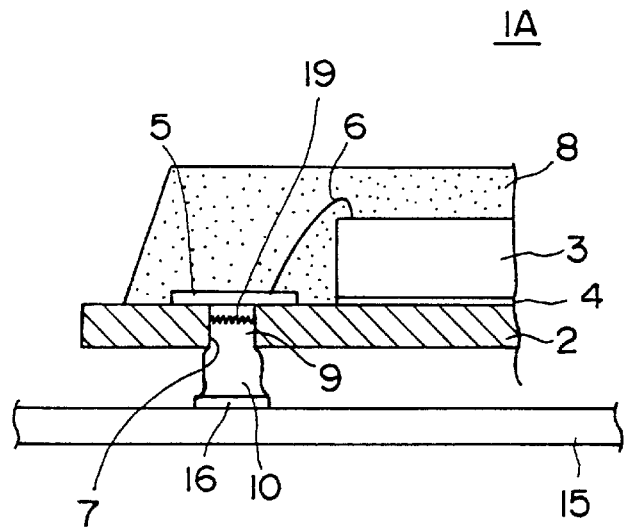
FIG. 9 is a cross-sectional view of a part of the conventional semiconductor device shown in FIG. 1 for explaining a crack generated in a solder ball.
Figure 10:
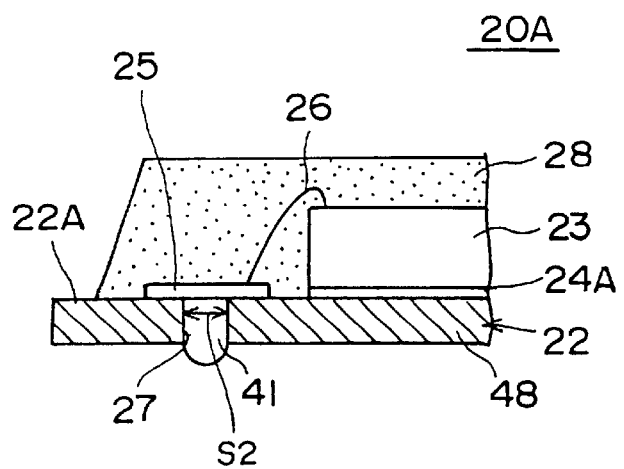
FIG. 10 is a cross-sectional view of a part of a semiconductor device according to a first embodiment of the present invention.

A description will now be given, with reference to FIG. 10, of a first embodiment of the present invention. FIG. 10 is a cross-sectional view of a part of a semiconductor device 20A according to the first embodiment of the present invention.

In FIG. 10, the semiconductor device 20A has an FBGA type package structure so as to achieve a fine pitch arrangement of external connection electrodes. The semiconductor device 20A comprises a tape substrate 22 (hereinafter simply referred to as substrate 22), a semiconductor chip 23, a wire 26, a plastic package 28 and a plurality of external connection electrodes 41 (only one shown in the figure). Each of the external connection electrodes is formed as a plating bump.

The substrate 22 comprises a plastic tape 48 and a plurality of electrode films 25 (only one shown in the figure). The plastic tape 48 is made of polyimide. The semiconductor chip 23 is mounted on a surface 22A of the plastic tape 48 via an adhesive 24A.

A plurality of through holes 27 (only one shown in the figure) are formed in predetermined positions of the substrate 22. An opening of each through hole 27 on the side where the semiconductor chip 23 is provided is closed by an electrode film 25 serving as an electrode. The electrode film 25 is formed by plating copper (Cu) or gold (Au). That is, the end of each through hole 27 opening on the surface 22A is closed by the electrode film 25. It should be noted that the through holes 27 can be easily formed in the substrate 22 by laser machining.

When the semiconductor chip 23 is mounted on the mounting surface 22A of the substrate 22, the semiconductor chip 23 is placed in the face-up position. Accordingly, the circuit forming surface of the semiconductor chip 23 faces upward in the figure, and the pad of the semiconductor chip 23 to which the wire 26 is bonded also faces upward.

An end of the wire 26 is bonded to the pad provided on the circuit forming surface of the semiconductor chip 23, and the other end of the wire 26 is bonded to the electrode film 25. The plastic package 28 is formed by a transfer molding method so as to protect the semiconductor chip 23, the electrode film 25 and the wire 26.

The plating bump 41 serves as an external connection terminal. The plating bump 41 is formed by depositing a metal on the electrode film 25. The metal forming the plating bump 41 is selected from a group consisting of nickel, copper and gold. Either of an electric plating method and an electroless plating method can be used for forming the plating bump 41.

Figure 11A:
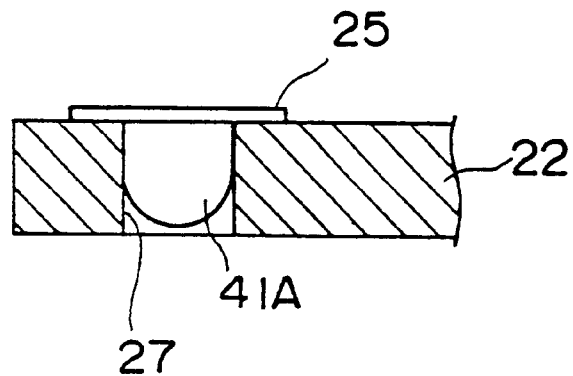
FIG. 11A is a cross-sectional view of a part of a substrate provided with a through hole in which a part of a plating bump is formed.

FIG. 11A is a cross-sectional view of a part of the substrate 22 provided with the through hole 27 in which a part of the plating bump 41A is formed. In FIG. 11A, the plating bump 41A is formed by plating the metal on the electrode film 25 for a predetermined time period so that the plating bump grows to a predetermined height within the through hole 27. As show in the figure, the plating bump 41A grows while filling the through hole 27.

Figure 11B:
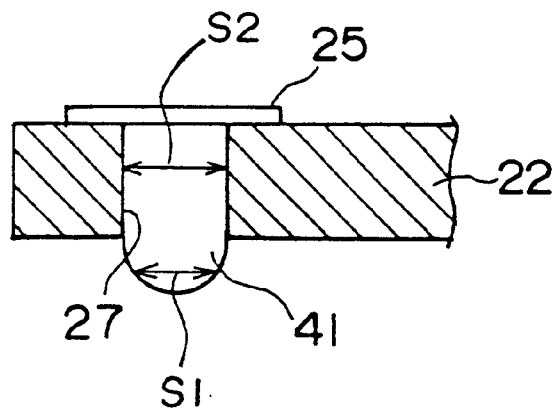
FIG. 11B is a cross-sectional view of a part of the substrate provided with the through hole in which the entire plating bump is formed.

FIG. 11B is a cross-sectional view of a part of the substrate 22 provided with the through hole 27 in which the entire plating bump 41 is formed. In FIG. 11B, a part of the plating bump 41 protrudes from the through hole 27. Additionally, in the present embodiment, the diameter S1 of the protruding portion of the plating bump 41 is equal to or smaller than the diameter of the through hole 27 ($S1 \leq S2$).

Figure 12:
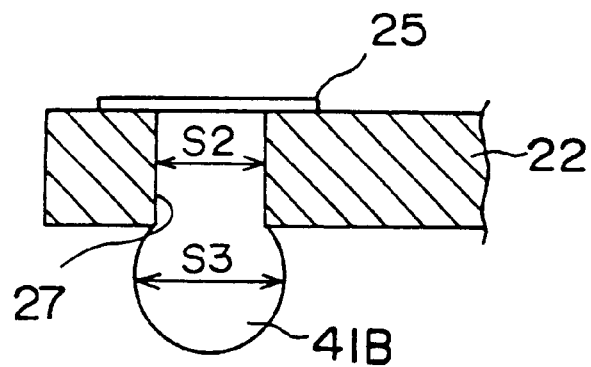
FIG. 12 is a cross-sectional view of a part of the substrate having the through hole provided with a plating bump having an excessive diameter.

The diameter S1 of the protruding part of the plating electrode 42 can be achieved by controlling a speed and time of the plating process for forming the plating bump 41. Specifically, if the plating time is longer than the plating time corresponding to the plating bump 41 shown in FIG. 11B, the deposition of the plating material on the surface of the plating bump 41 shown in FIG. 11B continues, which results in the formation of the plating bump 41B shown in FIG. 12. The diameter S3 of the protruding portion of the plating bump 41B is larger than the diameter S2 of the through hole 27 ($S3>S2$).

However, if the diameter S3 of the protruding portion of the plating bump 41B is increased, the distance (pitch) between the adjacent plating bumps 41B must be increased so as to maintain an appropriate distance therebetween. However, in the present embodiment, the diameter S1 of the protruding portion of the plating bump 41 is equal to or smaller than the diameter S1 of the through hole 27. Thus, the distance (pitch) between the adjacent plating bumps 41 can be maintained small, and, thereby a sufficient distance can be maintained between adjacent plating bumps 41 when the number of plating bumps 41 is increased.

Additionally, in the present embodiment, since the plating bump 41 formed by a plating method is used as an external connection terminal, processes associated with formation of a solder ball, including application of a solder paste, conveyance of the solder ball and positioning of the solder ball be omitted. Accordingly, the process for forming the external connection terminal is simplified and the manufacturing cost of the external connection terminal can be reduced.

Figure 13:
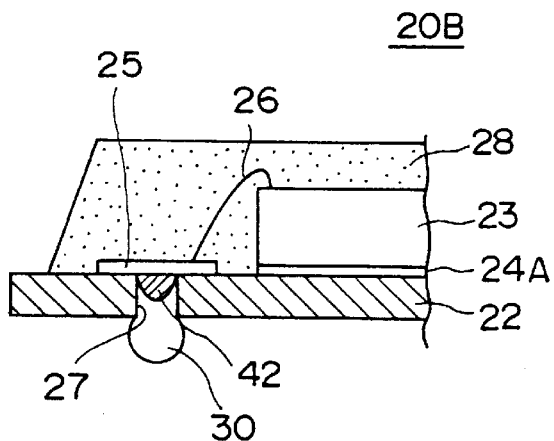
FIG. 13 is a cross-sectional view of a part of a semiconductor device according to a second embodiment of the present invention.
Figure 14A:
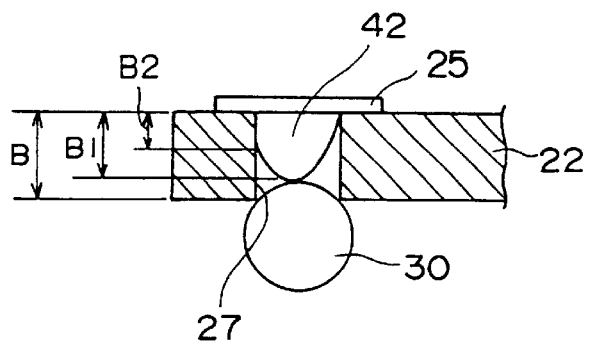
FIGS. 14A and 14B are cross-sectional views of a part of the substrate provided with a solder ball for explaining a bonding process of the solder ball.
Figure 14B:
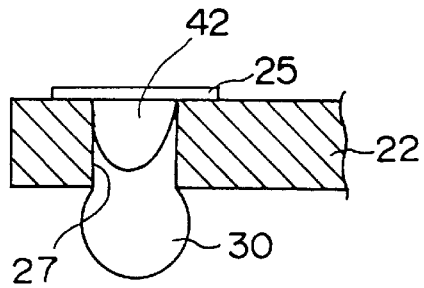

A description will now be given, with reference to FIGS. 13, 14A and 14B, of a second embodiment of the present invention. FIG. 13 is a cross-sectional view of a part of a semiconductor device 20B according to the second embodiment of the present invention. FIGS. 14A and 14B are cross-sectional view of a part of the substrate provided with a solder ball for explaining a bonding process of the solder ball. In FIGS. 13, 14A and 14B, parts that are the same as the parts shown in FIG. 10 are given the same reference numerals, and descriptions thereof will be omitted.

In the present embodiment, the external connection terminal comprises a solder ball 30 (second electrode part) and a base electrode part 42 (first electrode part).

When semiconductor devices become dense and the diameter of the through hole becomes small as mentioned above, the open fault frequently occurs since the solder ball cannot be inserted into the through hole to a sufficient depth. The open fault is caused by a large distance between the solder ball and the electrode film when the solder ball is placed on the open side of the through hole.

Accordingly, in the present embodiment, the base electrode part 42 is formed on the electrode film 25 before the solder ball 30 is provided on the open side of the through hole 27. The base electrode part 42 is can be formed by at least one of nickel, copper and gold which are bondable to the solder ball 30.

Additionally, since the plating method requires a relatively long process time, the height of the base electrode part 42 is preferably as small as possible when throughput is considered. On the other hand, when reliable bonding to be achieved between the solder ball 30 and the electrode film 25 is concidered, the height of the base electrode part 42 is preferably as high as possible. Accordingly, in the present embodiment, the height B1 of the base electrode part 42 from the electrode film 25 is set to be smaller than the depth B of the through hole 27 and greater than the height B2 of the middle point of the through hole 27 ($B2<B1<B$).

According to the above-mentioned structure, when the solder ball 30 is provided to the open side of the through hole 27, the distance between the solder ball 30 and the base electrode part 42 is reduced to the extent that the solder ball 30 almost contacts the base electrode part 42 as shown in FIG. 14A. Since the solder ball 30 positively contacts the base electrode part 42 in the subsequent heating process as shown in FIG. 14B, no air gap can be formed between the solder ball 30 and the base electrode part 42. Thus, the solder ball 30 can be electrically connected to the electrode film 25 via the base electrode part 42, which improves the reliability of the semiconductor device 20B.

Figure 15:
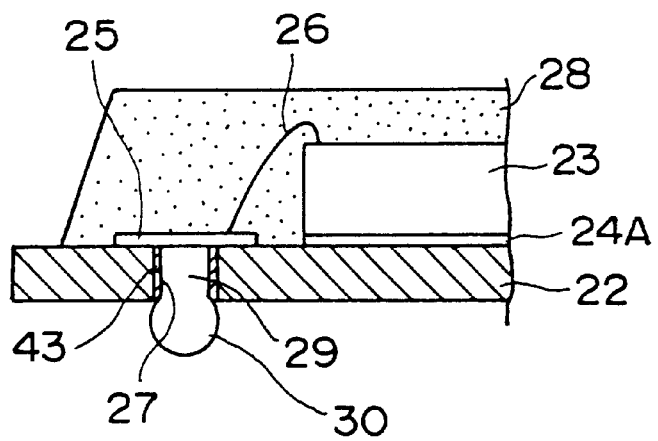
FIG. 15 is a cross-sectional view of a semiconductor device according to a third embodiment of the present invention.
Figure 16:
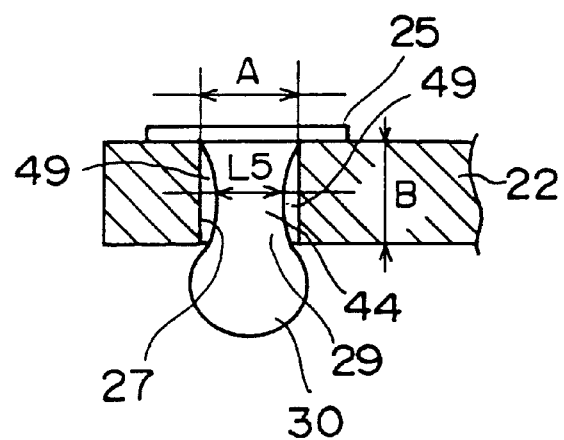
FIG. 16 is a cross-sectional view of a part of a substrate provided with a through hole in which a constriction occurs in the solder ball.
Figure 17:
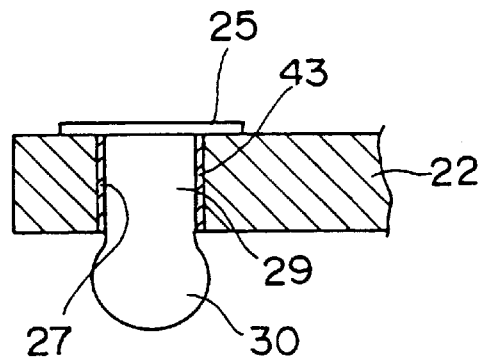
FIG. 17 is a cross-sectional view of a part of the substrate provided with a through hole having a thin film on an inner wall thereof.

A description will now be given, with reference to FIGS. 15 through 17, of a third embodiment of the present invention. FIG. 15 is a cross-sectional view of a semiconductor device according to the third embodiment of the present invention. FIG. 16 is a cross-sectional view of a part of a substrate provided with a through hole in which a constriction occurs in the solder ball. FIG. 17 is a cross-sectional view of a part of the substrate provided with a through hole having a thin film on an inner wall thereof.

The semiconductor device 20C according to the present embodiment has a thin film 43 on the inner wall of the through hole 27 formed in the substrate 22. Additionally, in the semiconductor device 20C, the diameter A of the through hole 27 and the thickness B of the substrate 22 satisfy a relationship (B/A)≦0.3.

It should be noted that the provision of the thin film 43 and satisfaction of the relationship (B/A)≦0.3 are not always provided in the same semiconductor device.

A description will now be given of the thin film 43 on the inner wall of the through hole 27. The thin film 43 is formed of a material which is bondable to a solder which is a material of the solder ball 30 and also bondable to polyimide which is a material of substrate 22. Specifically, the thin film can be formed of one of metals selected from a group consisting of nickel, copper and gold.

The thin film 43 is formed on the inner wall of the through hole 27 which is a very small hole. The thin film 43 can be formed on the inner wall of the through hole by a plating method. The thickness of the thin film 43 is preferably in the range of 0.5 $\mu$m to 10 $\mu$m.

By forming the thin film 43 on the inner wall of the through hole 27, the via part 29 in the through hole 27 is prevented from having a constriction 44. A description will now be given, with reference to FIG. 16, of the constriction 44.

As shown in FIG. 16, the constriction 44 refers to a portion of the via part 29 having a diameter L5 smaller than the diameter A of the through hole 27. Accordingly, if the constriction 44 occurs, an air gap 49 is formed between the inner wall of the through hole and the via part 29 (solder ball 30).

If the air gap 49 is generated between the via part 29 (solder ball 30) and the inner wall of the through hole 27, the strength of the via part 29 is reduced. In the worst case, a crack occurs in the constriction 44 or the via part 29 separate from the electrode film 25.

Although the mechanism of generation of the constriction 44 is not clear, it is assumed that the following matters influence the generation of the constriction 44: ① defect in bondability between the substrate 22 and the via part 29 (solder ball 30); and ② mismatch (improper matching) of the diameter A of the through hole 27, that is, an area of the through hole 27 and the thickness B of the substrate 22.

The thin film 43 is provided for solving the cause of generation of ①. That is, if the thin film 43 made of a material which is well-bondable to the via part (solder ball 30) is formed on the inner wall of the through hole 27, the via part 29 and the solder ball 30 are positively bonded to the thin film 43 (that is, the inner wall of the through hole 27).

Accordingly, an air gap is not formed between the via part 29 (solder ball 30) and the through hole 27. That is, the constriction 44 does not occur between the via part 29 (solder ball 30) and the through hole 27. Thus, the via part 29 (solder ball 30) is firmly bonded to the inner wall of the through hole 27. Accordingly, the via part 29 in the through hole 27 is prevented from cracking, and the via part 29 is prevented from being separated from the electrode film 25, which results in improvement in the reliability of the semiconductor device 2C.

A description will now be given of a relationship between the diameter A of the through hole 27 and the thickness B of the substrate 22. In the present embodiment, the ratio (B/A) of the thickness B of the substrate 22 to the diameter A of the through hole 27 is rendered to satisfy the relationship (B/A)≦0.3.

Consideration will now be given of the influence of the diameter A of the through hole 27 to the bonding of the via part 29 and the solder ball 30 to the inner wall of the through hole 27. The strength of the via part 29 and the solder ball 30 within the through hole 27 increases as the diameter A of the through hole 27 increases. This is because the cross sectional area of the via part 29 and the solder ball 30 within the through hole 27 increases as the diameter A of the through hole 27 increases.

Consideration will also be given to the influence of the thickness B of the substrate 22 to the bonding of the via part 29 and the solder ball 30 to the inner wall of the through hole 27. The strength of the via part 29 and the solder ball 30 within the through hole 27 increases as the thickness B of the substrate 22 decreases. This is because the distance between the solder ball 30 and the electrode film 25 decreases as the thickness B of the substrate 22 decreases.

Suppose that the diameter A and the thickness B are rendered to be independent from each other so as to increase the diameter A irrespective of the thickness B and decrease the thickness B of the substrate 22 irrespective of the diameter A. The resulting semiconductor chip 23 could not have a dense structure (in relation to the diameter A) and the strength of the substrate 22 would be reduced (in relation to the thickness B).

However, when the diameter A of the through hole 27 and the thickness B of the substrate 22 are related to each other so that the relationship (B/A)≦0.3 is satisfied, the semiconductor chip 23 can have a dense structure and the strength of the substrate 22 can be increased while the possibility of the open fault due to breakage of the via part 29 and the solder ball 30 within the through hole 27 is prevented.

FIG. 25 shows a result of experiments performed by the inventors. As shown in FIG. 25, three test samples 1, 2 and 3 were prepared that satisfy the relationship (B/A)≦0.3, and two comparison samples 1 and 2 were prepared that do not satisfy the relationship (B/A)≦0.3. The ball pitch of the solder balls were set to 0.5 mm except for the test sample 3 whose ball pitch was 0.8 mm.

As can be appreciated from FIG. 25, the fault rate (open fault) of the test samples 1, 2 and 3 that satisfy the relationship (B/A)≦0.3 was extremely low (0%). Additionally, it can be appreciated the fault rate was decreased by satisfying the relationship (B/A)≦0.3 irrespective of the ball pitch of the solder balls. Accordingly, it was confirmed that the open fault can be prevented by establishing the relationship (B/A)≦0.3 where the ratio (B/A) is a ratio of the thickness B of the substrate 22 to the diameter A of the through hole 27.

Figure 18:
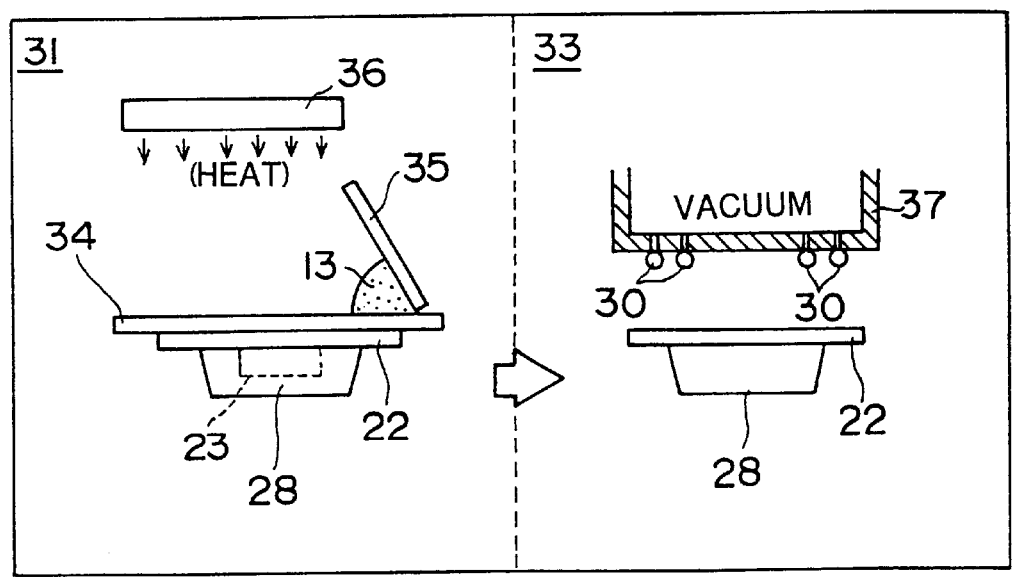
FIG. 18 is an illustration of a manufacturing apparatus of the semiconductor device according to the third embodiment of the present invention.

A description will now be given of a manufacturing method of the semiconductor device 20C according to the third embodiment of the present invention. FIG. 18 is an illustration of a manufacturing apparatus of the semiconductor device according to the third embodiment of the present invention.

The semiconductor device manufacturing apparatus shown in FIG. 18 comprises a paste printing unit 31 and a ball attaching unit 33.

The paste printing unit 31 comprises a print mask 34, a squeegee 35 and a heater 36. When the substrate 22 on which the semiconductor chip 23 is mounted with the plastic package 28 is loaded, the print mask 34 is attached to the substrate 22 and the solder paste 13 is printed or applied to the substrate 22 by the squeegee 35.

An area of the substrate 22 to which the solder paste 13 is applied is heated by the heater 36 during the printing process of the solder paste 13. That is, the printing process of the solder paste 13 is performed under the heating atmosphere. The heating temperature is set to be a temperature at which the solder paste 13 can be softened. That is, the heating temperature is set to a temperature at which the solder paste 13 can be easily filled into the through hole 27.

The print mask 34 is provided with mask holes at positions corresponding to the positions of the through holes 27 formed in the substrate 22. Accordingly, the solder paste is filled into each through hole 27 by performing the printing process.

In the present embodiment, the solder paste 13 is filled into each through hole 27 so that the solder paste 13 contacts the electrode film 25 provided at the opposite end of the through hole 27. Specifically, the solder paste 13 is provided to a deep part of the through hole 27 by controlling the pressing force exerted by the squeegee 35 and an inclination angle of the squeegee 35.

Additionally, as mentioned above, the printing process of the solder paste 13 is performed under the heating atmosphere in which the solder paste 13 is softened. This also facilitates the solder paste 13 being provided to the deep part of the through hole 27. It should be noted that the pressing force and the inclination angle of the squeegee 35 would be varied according to the size of the substrate 22, a viscosity of the solder paste 13 and the heating temperature of the heater 36.

After the printing of the solder paste 13 is completed in the paste printing unit 31, the substrate 22 on which the solder paste 13 is printed is conveyed to the ball attaching unit 33. The ball attaching unit 33 is provided with a ball conveying jig 37. The ball conveying jig 37 has suction holes at positions corresponding to the through holes 27 formed in the substrate 22 so that the solder balls 30 can be attached to the ball conveying jig 37 by suctioning the solder balls 30 through the suction holes.

Figure 19A:
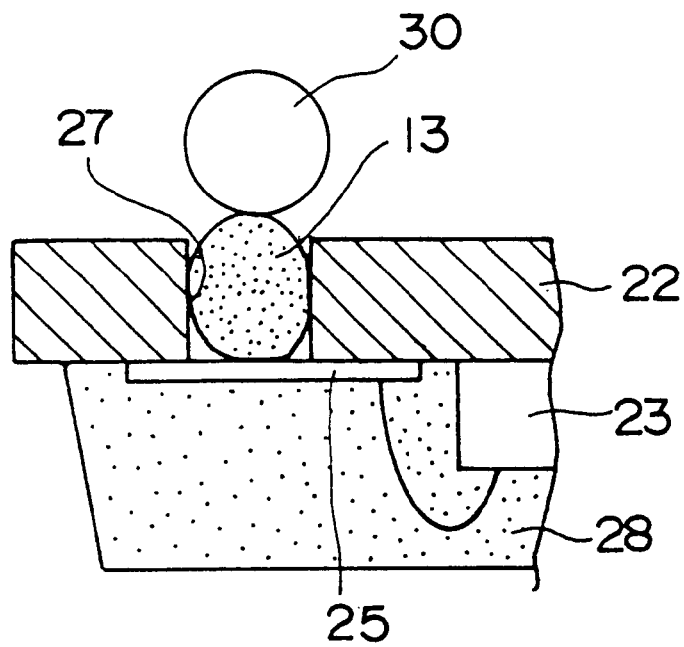
FIG. 19A is a side view of a solder ball placed on a solder paste provided in the through hole.

The ball attaching jig 37 provided with the solder balls 30 is moved to a position directly above the substrate 22 and, then, is moved downward so as to place the solder balls 30 on the substrate 22 at positions where the through holes 27 are provided. FIG. 19A is a side view of the solder ball 30 placed on the solder paste 13 provided in the through hole 27.

A mentioned above, in the present embodiment, the solder paste 13 is provided in the deep part of the through hole 27 in the printing process so that the solder paste 13 contacts the electrode film 25 at the opposite end of the through hole 27. Accordingly, when the solder ball 30 is placed at the open end of each through hole 27, the solder ball 30 contacts the solder paste 13, and there is no air gap formed between the solder ball 30 and the solder paste 13.

Figure 19B:
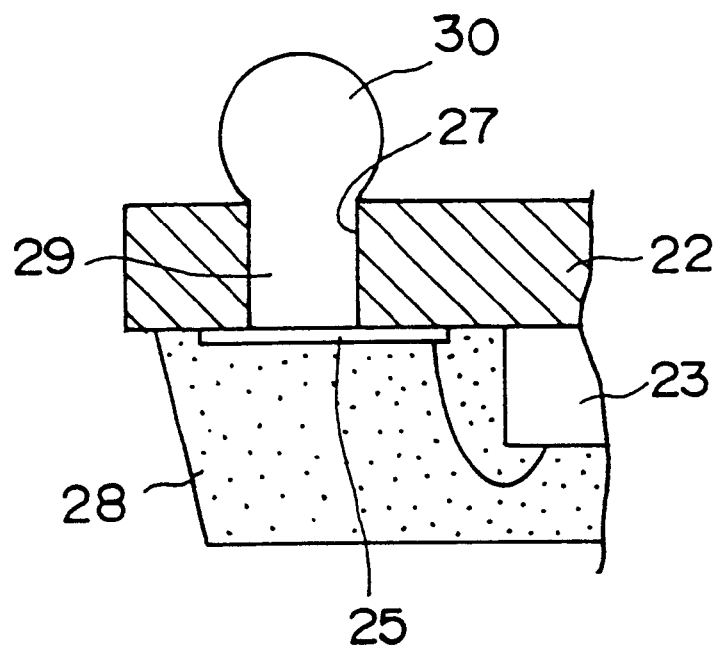
FIG. 19B is a side view of the solder ball after the solder paste is melted.

Thereafter, the substrate 22 is returned to the paste printing unit 31 by the conveying unit (not shown in the figure). The substrate is subjected to a heating process in the paste printing unit 31 so as to melt the solder ball 30 and the solder paste 13, and, thereby, the solder ball 30 and the via part 29 are formed on the substrate as shown in FIG. 19B. It should be noted that the print mask 35 and the squeegee 35 are moved away from the paste printing unit 31 when the heating process is performed to melt the solder ball 30 and the solder paste 13.

As mentioned above, in the present embodiment, since the solder paste 13 is provided to the deep part of the through hole 27 so that the solder paste 13 contacts the electrode film 25 in the printing process of the solder paste 13, the open fault can be positively prevented from occurring in a portion between the via part 29 and the electrode film 25 and a portion between the solder ball 30 and the via part 29. Thereby, the semiconductor device manufactured by the semiconductor manufacturing apparatus shown in FIG. 18 has a high reliability.

Figure 20:
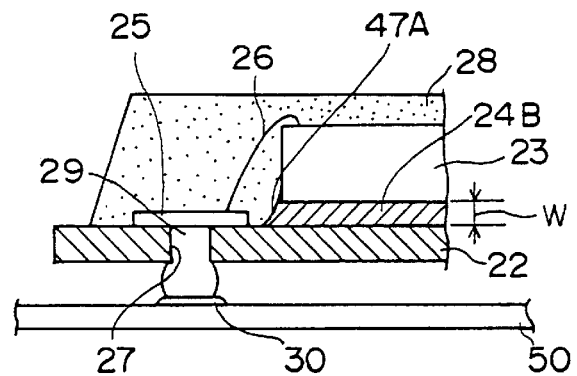
FIG. 20 is a cross-sectional view of a semiconductor device according to a fourth embodiment of the present invention.

A description will now be given, with reference to FIG. 20, of a semiconductor device according to a fourth embodiment of the present invention. FIG. 20 is a cross-sectional view of the semiconductor device 20D according to the fourth embodiment of the present invention. It should be noted that FIG. 20 shows the semiconductor device 20D mounted on a mounting board 50.

The semiconductor apparatus 20D according to the present embodiment is provided with an adhesive 24B to fix the semiconductor chip 23 to the substrate 22. The thickness of the layer of the adhesive 24B ranges from 100 $\mu$m to 150 $\mu$m.

In the present embodiment, the following method is used to form the thick layer of the adhesive 24B in the chip mounting process.

Figure 21A:
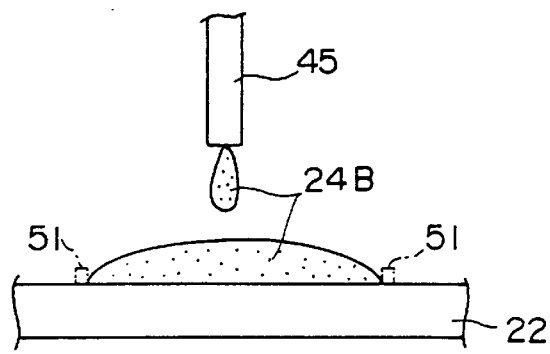
FIG. 21A is an illustration for explaining a process of applying an adhesive to the substrate.

As shown in FIG. 21A, the adhesive 24B is applied to a chip mounting position of the substrate 22 by a dispenser 45. Since the adhesive 24B has a higher viscosity and a higher thixotropy index than a normally used adhesive, the adhesive 24B does not spread in a large area and can be applied in the form of a layer having a predetermined large thickness. It should be noted that a dam wall 51 (indicated by single dashed chain line in FIG. 21A) may be formed on the substrate 22 so as to prevent the adhesive 24B from spreading beyond a predetermined area.

After the adhesive 24B is applied onto the substrate 22, the semiconductor chip 23 is placed on the layer of the adhesive 24B. Thereafter, a heating process is performed so as to cure the adhesive 24B. In the heating process, the substrate 22 is positioned upside down, that is, the substrate 22 is positioned above the semiconductor chip 23 with the layer of the adhesive 24B therebetween.

In the heating process, heat is applied by a heating jig 46 having a flat surface which is brought into contact with the semiconductor chip 23. In a state in which the semiconductor chip 23 is in contact with the flat surface of the heating jig 46, a distance H between the substrate 22 and the flat surface of the jig 46 is set so that a distance W between the substrate 22 and the semiconductor chip 23 is equal to the above-mentioned thickness of the layer of the adhesive 24B in the range of 100 $\mu$m to 150 $\mu$m.

According to the above-mentioned structure, the weight of the semiconductor chip 23 acts to move the semiconductor chip 23 away from the substrate 22. Accordingly, the layer of the adhesive 24B having a large thickness can be easily and positively formed. Additionally, the substrate 22 and the heating jig 46 are positioned so that the substrate 22 is parallel to the flat surface of the heating jig 46 with high accuracy. Thus, the thickness W of the layer of the adhesive 24B which has been cured is uniform over the entire layer of the adhesive 24B.

In the present embodiment, the thickness W of the layer of the adhesive 24B is set to be a relatively large thickness in the range of 100 μm to 150 μm, and, thereby, the solder ball 30 is prevented from being damaged due to the difference in the thermal expansion rate between the semiconductor chip 23 and the mounting board 50. It should be noted that the thermal expansion rate of the semiconductor chip 23 is about 4 ppm/° C., and the thermal expansion rate of the mounting board 50 is about 16 ppm/° C.

If the thermal expansion rates of the semiconductor chip 23 and the mounting board 50 are different from each other, a large stress is generated in the solder ball 30 due to the difference in the thermal expansion when the heating process is performed to mount the semiconductor device 20D to the mounting board 50. In the worst case, the solder ball 30 is damaged or the solder ball 30 is separated from the substrate 22 or the mounting board 50 due to the large stress.

However, in the present embodiment, the layer of the adhesive 24B can serve as a stress absorber by forming the thick layer of the adhesive 24B having the thickness ranging from 100 μm to 150 μm. That is, the layer of the adhesive 24B attenuates the stress concentrated in the solder ball 30. Thus, the solder ball 30 is prevented from being damaged due to the difference in thermal expansion between the semiconductor chip 23 and the mounting board 50, which results in a high reliability of the semiconductor device 20D.

Figure 22:
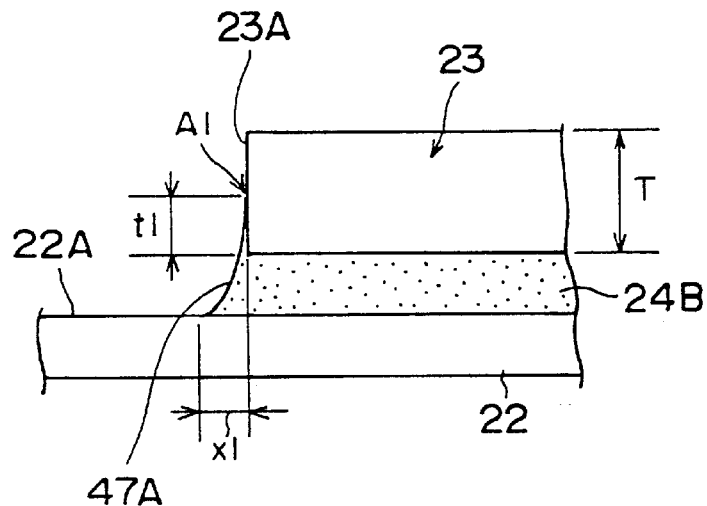
FIG. 22 is a side view of a part of the semiconductor device according to the fourth embodiment of the present invention.

A description will now be given of a filet 47A formed by the adhesive 24B. The filet 47A is a curved portion of the layer of the adhesive 24B formed on a side of the semiconductor chip 23 as shown in FIG. 22 when the semiconductor chip 32 is placed on the layer of the adhesive 24B.

In the present embodiment, a height T of a side surface 23A of the semiconductor chip 23 and height t1 of the filet 47A from the lower end of the side surface 23A are rendered to satisfy a relationship $(0.2 \times T) \leq t1 < (0.6 \times T)$. By setting the height t1 of the filet 47A so as to satisfy the relationship $(0.2 \times T) \leq t1 < (0.6 \times T)$, the size of the semiconductor device 20D can be reduced. The reason for the reduction in the size of the semiconductor device 20D is as follows.

The height t of the filet 47A of the adhesive 24B has a relationship with an area of the substrate 22 occupied by the adhesive 24B. That is, the filet 47A is formed in a curved shape starting from the surface of the substrate 22 toward the side surface 23A of the semiconductor chip 23. Thereby, the length of the curved shape increases as the height t1 from the lower end of the side surface 23A of the semiconductor chip 23 increases. Accordingly, an amount (indicated by x1 in FIG. 22) of adhesive 24B extending out from underneath the semiconductor chip 23 increases as the length of the curved shape increases.

Any elements such as an electrode film or a wire cannot be provided in the area occupied by the adhesive 24B on the surface of the substrate 22. Accordingly, if the height t of the filet 47A of the adhesive 24B is increased, the size of the semiconductor device 20D is also increased.

However, in the present embodiment, the height t1 of the filet 47A from the lower end of the side surface 23A of the semiconductor chip 23 is set to a small value by limiting the height t1 so as to satisfy the relationship $(0.2 \times T) \leq t1 < (0.6 \times T)$. Accordingly, the amount x1 of the adhesive 24B extending out from the periphery of the semiconductor chip 23 is reduced, and, thereby, the size of the substrate 22 can be reduced and subsequently the size of the semiconductor device 20D is reduced.

A description will now be given of the characteristics of the adhesive 24B used in the present embodiment.

The adhesive 24B used in the present embodiment has a higher viscosity and a higher thixotropy index than the conventionally used adhesive 4. Specifically, the adhesive 24B used in the present embodiment has a viscosity ranging from 30,000 cps to 70,000 cps and a thixotropy index ranging from 1.0 to 4.0 while the conventionally used adhesive has a viscosity ranging from 5,000 cps to 30,000 cps and a thixotropy index ranging from 4.0 to 6.0.

Figure 23:
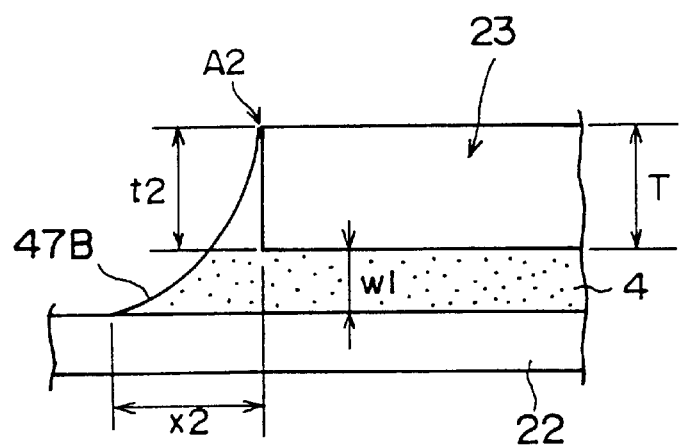
FIG. 23 is a side view of a part of a semiconductor device using an adhesive having a low viscosity.

FIG. 23 shows a shape of a filet 47B formed when the thickness W1 of the conventionally used adhesive 4 is set to be in the range of 100 μm to 150 μm. The conventionally used adhesive 4 having relatively low viscosity and low thixotropy index has high fluidity. Thus, the height t2 of the filet 47B from the lower end of the side surface 23A of the semiconductor chip 23 is almost equal to the height (thickness) of the semiconductor chip 23 ($t2 \approx T$).

Accordingly, as shown in FIG. 23, if an attempt is made to increase the thickness of the layer of the conventionally used adhesive 4 to be in the range of 100 μm to 150 μm, the height t2 of the filet 47B from the lower end of the side surface 23A of the semiconductor chip 23 becomes large. Thereby, the length of the curved shape of the filet 47B is increased, and an amount (indicated by the arrow x2 in FIG. 23) of the adhesive extending out from the periphery of the semiconductor chip 23 is increased, which prevents the size of the semiconductor device from being reduced.

On the other hand, in the present embodiment, since the adhesive 24B having a high viscosity and a high thixotropy index is used, the height t1 of the filet 47A can be reduced even when the thickness W of the layer of the adhesive 24B is set to be in the range of 100 μm to 150 μm. Thus, the reduction in size of the semiconductor device 24D can be achieved.

Figure 24:
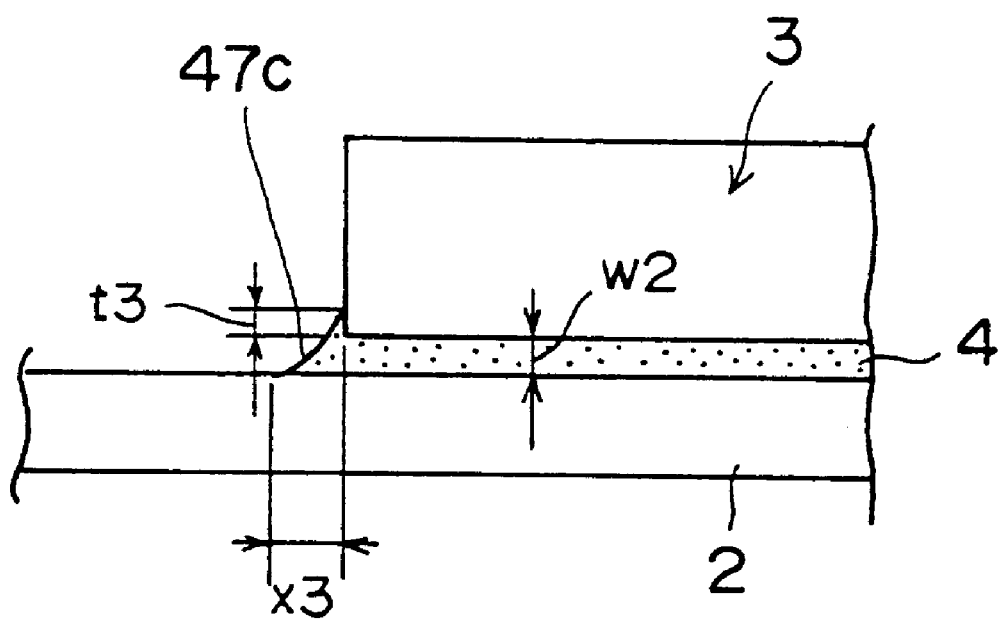
FIG. 24 is a side view of a part of a semiconductor device using an adhesive to fix a semiconductor chip to a substrate.

If the thickness W2 of the layer of the adhesive 4 is small as shown in FIG. 24, a filet 47C formed by the adhesive 4 is originally small. Thus, an amount (indicated by the arrow x3 in FIG. 24) of the adhesive 4 extending out from the periphery of the semiconductor chip 23 is small. This means that if the thickness W2 of the layer of the adhesive 4 is small, the filet 47C provides less influence on the size of the semiconductor device.

When the layer of the adhesive 24B is used as a stress absorbing layer as mentioned above, the coefficient of elasticity and the thermal expansion rate of the adhesive 24B are important factors. That is, if the coefficient of elasticity of the adhesive 24B is high, that is, if the adhesive 24B after being cured is hard, a stress generated due to the difference in the thermal expansion between the semiconductor chip 23 and the mounting board 50 cannot be absorbed by the layer of the adhesive 24B. Thereby, the solder ball 30 may be damaged or separated from the mounting board 50.

When the thermal expansion rate of the adhesive 24B is much less than the thermal expansion rate of the semiconductor device 23, a stress is generated between the adhesive 24B and the semiconductor chip 23 due to the difference in thermal expansion. Similarly, when the thermal expansion rate of the adhesive 24B is much greater than the thermal expansion rate of the mounting board 50, a stress is generated between the adhesive 24B and the mounting board 50 due to the difference in thermal expansion.

In order to eliminate the above-mentioned problems, the adhesive 24B used in the present embodiment has a coefficient of elasticity ranging from 200 kgf/mm$^2$ to 800 kgf/mm$^2$ and a thermal expansion rate ranging from $6 \times 10^{-6}$/° C. to $15 \times 10^{-6}$/° C. Thereby, the solder ball 30 is prevented from being damaged or separated from the mounting board 50.

Additionally, in the semiconductor device 24B according to the present embodiment, the layer of the adhesive 24B is formed to be a uniform thickness. Specifically, the layer of the adhesive 24B is formed to have a thickness within allowable tolerance of ±20 μm. By forming the layer of the adhesive 24B having a uniform thickness, the stress generated in the layer of the adhesive 24B can be prevented from being localized.

That is, if the thickness of the layer of the adhesive 24B varies, there is a difference in magnitude of stress between a thicker portion and a thinner portion. Accordingly, the stress is localized in the thinner portion of the layer of the adhesive 24B, and a defect may occur in the thinner portion such as separation of the layer of the adhesive 24B. Accordingly, the stress generated in the solder ball 30 cannot be reduced. However, in the present embodiment, since the thickness of the layer of the adhesive 24B is rendered to be uniform, the localization of stress generated in the adhesive 24B can be prevented. Thus, the layer of the adhesive 24B is prevented from being separated from the mounting board 50 or the semiconductor chip 23, and the solder ball 30 is positively protected.

Figure 21B:
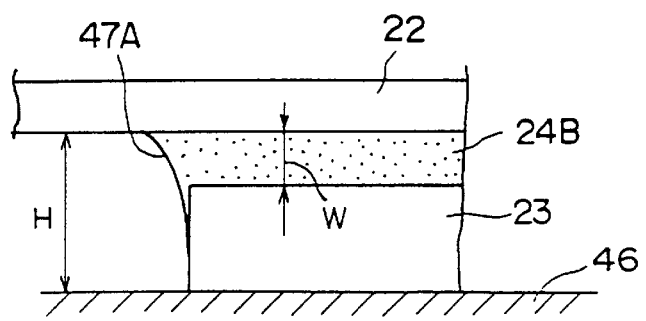
FIG. 21B is an illustration for explaining a heating process of heating the adhesive between the semiconductor chip and the substrate.
Figure 26:
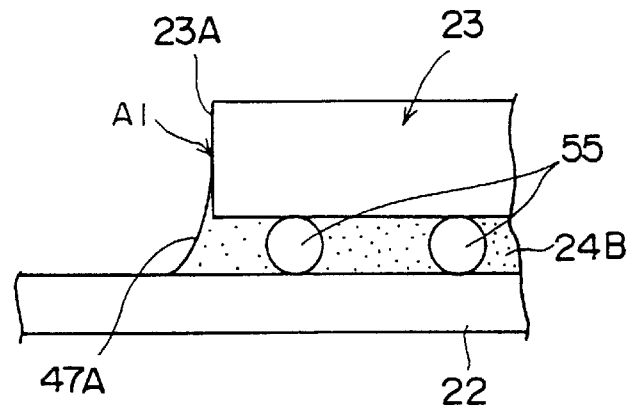
FIG. 26 is a cross-sectional view of a part of a semiconductor device using an adhesive containing particles serving as spacers.

The method for forming the layer of the adhesive 24B having a uniform thickness is not limited to the method described with reference to FIG. 21B. The layer having a uniform thickness can be formed by adding spacer particles 55 having a particle diameter in the range of 100 μm to 150 μm to the adhesive 24B as shown in FIG. 26. In such a structure, the thickness of the layer of the adhesive 24B becomes uniform, and the layer of the adhesive 24B is prevented from being separated from the semiconductor chip 23 or the substrate 22 and the solder ball 30 can be protected.

Figure 27:
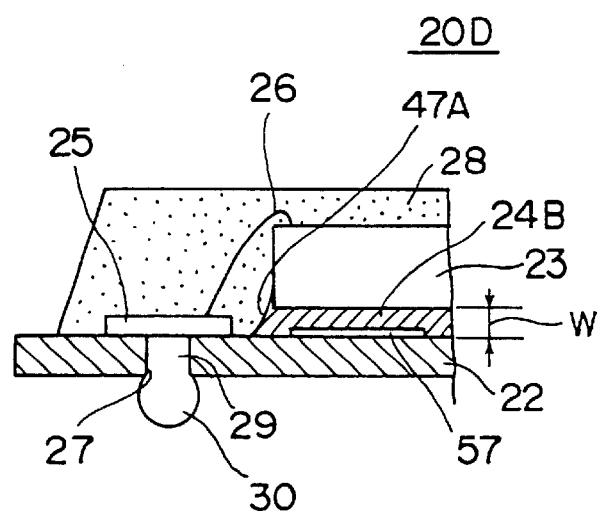
FIG. 27 is a cross-sectional view of a part of a semiconductor device provided with deformation preventing patterns.

Additionally, the fluctuation in the thickness of the layer of the adhesive 24B is also generated by deformation of the substrate 22. As for a method for preventing the deformation of the substrate 22, it is considered to form, as shown in FIG. 27, deformation preventing patterns 57 in an area excluding the area where the electrode films 25 are formed.

The deformation preventing patterns 57 may be formed concurrently with the formation of the electrode films 25. In this case, the deformation preventing pattern 57 is made of the same material as the electrode films 25. However, the deformation preventing patterns 57 can be formed by a different material than the material of the electrode films 25. In this case, the deformation preventing patterns 57 can be formed of a material appropriate for preventing deformation. As mentioned above, deformation of the substrate 22 can be prevented by providing the deformation preventing patterns 57. Thereby, the thickness of the substrate 22 can be substantially uniform. Thus, the layer of the adhesive 24B is prevented from being separated from the semiconductor chip 23 or the substrate 22, and the solder ball 30 can be positively protected.

Figure 28:
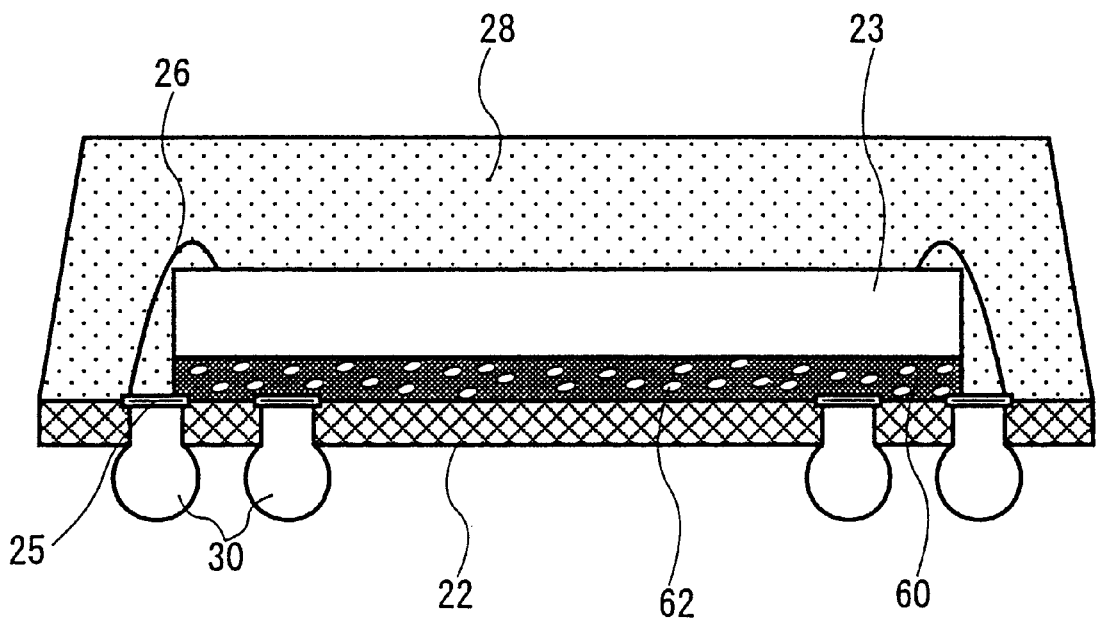
FIG. 28 is a cross sectional view of a semiconductor device according to the fifth embodiment of the present invention.

A description will now be given of a fifth embodiment of the present invention. FIG. 28 is a cross-sectional view of a semiconductor device 20E according to the fifth embodiment of the present invention. In FIG. 28, parts that are the same as the parts shown in FIG. 10 are given the same reference numerals, and descriptions thereof will be omitted.

The semiconductor device 20E according to the present embodiment is provided with an adhesive 60 so as to fix the semiconductor chip 23 to the substrate 22. The adhesive 60 is selected to have an appropriate thermal expansion rate so as to prevent breakage of wiring patterns including the electrode film 25 formed on the substrate 22. The adhesive 60 used in the present embodiment contains a filler 62 which adjust the thermal expansion rate of the adhesive 60.

The layer of the adhesive 60 is provided between the semiconductor chip 23 and the substrate 22 so that the layer of the adhesive 60 is bonded to each of the semiconductor chip 23 and the substrate 22. If the thermal expansion rate ($\alpha$d) of the adhesive 60 is equal to the thermal expansion rate ($\alpha$c) of the semiconductor chip 23, there is no stress generated due to a difference in thermal expansion between the semiconductor device 23 and the adhesive 60. Similarly, if the thermal expansion rate ($\alpha$d) of the adhesive 60 is equal to the thermal expansion rate ($\alpha$i) of the substrate 22, there is no stress generated due to a difference in thermal expansion between the substrate 22 and the adhesive 60.

However, in general, the thermal expansion rate of the semiconductor chip 23 and the thermal expansion rate of the substrate are different from each other. Normally, the thermal expansion rate ($\alpha$i) of the substrate 22 is much higher than the thermal expansion rate ($\alpha$c) of the semiconductor chip 23. Thus, it is preferable that the thermal expansion rate ($\alpha$d) of the adhesive 60 be set to a value between the thermal expansion rate ($\alpha$c) of the semiconductor chip 23 and the thermal expansion rate ($\alpha$i) of the substrate 22 ($\alpha$c<$\alpha$d<$\alpha$i). In other words, it is preferable to select for the adhesive 60 an adhesive having a thermal expansion rate between the thermal expansion rate ($\alpha$c) of the semiconductor chip 23 and the thermal expansion rate ($\alpha$i) of the substrate 22.

Since a stress generated due to the difference in thermal expansion increases as the difference in thermal expansion increases, the thermal expansion rate ($\alpha$d) of the adhesive 60 is set to a value between the thermal expansion rate ($\alpha$c) of the semiconductor chip 23 and the thermal expansion rate ($\alpha$d) of the substrate 22 so that both the difference between the thermal expansion rate ($\alpha$c) of the semiconductor chip 23 and the thermal expansion rate ($\alpha$d) of the adhesive 60 and the difference between the thermal expansion rate ($\alpha$i) of the substrate 22 and the thermal expansion rate ($\alpha$d) of the adhesive 60 are smaller than the difference between the difference between the thermal expansion rate ($\alpha$c) of the semiconductor chip 23 and the thermal expansion rate ($\alpha$i) of the substrate 22.

Additionally, since the adhesive 60 also contacts the plastic package 28, it is preferable that the thermal expansion rate ($\alpha$d) of the adhesive 60 be equal to or approximate the thermal expansion rate ($\alpha$m) of the seal resin forming the plastic package 28 ($\alpha$d≈$\alpha$m).

According to the thus-constructed semiconductor device 2E, since the differences between the thermal expansion rate of the adhesive 60 and the thermal expansion rate of each of component parts contacting the adhesive 60 are set as small as possible, the stress caused by the difference in thermal expansion can be reduced. That is, according to the semiconductor device 20E of the present embodiment, breakage of the wiring patterns or a fracture of the external connection electrodes due to the difference in thermal expansion between the component parts can be reduced, and, therefore, a reliable semiconductor device can be achieved.

In the present embodiment, the thermal expansion rate of the adhesive 60 is adjusted to an appropriate value by adding the filler 62 to the adhesive 60. That is, the thermal expansion rate of the adhesive 60 is reduced to a value between the thermal expansion rates of the semiconductor chip 23 and the substrate 22, and is approximated to the thermal expansion rate of the seal resin. Particles of silicon oxide ($SiO_2$) are preferable for the filler 62. However, the material of the filler 62 is not limited to silicon oxide ($SiO_2$), and other materials may be used as long as the thermal expansion rate of the adhesive 60 can be reduced. Additionally, as for the material of the adhesive 60, an epoxy resin adhesive is preferably used. However, other adhesive materials such as a phenol resin adhesive may be used for the adhesive 60.

It should be noted that the coefficient of elasticity of the adhesive 60 is increased by adding the filler 62. However, in order to absorb and reduce the difference in thermal expansion between the semiconductor chip 23 and the substrate 22, it is preferable that the thermal expansion rate of the adhesive 60 be reduced while the coefficient of elasticity of the adhesive 60 is maintained to be as low as possible. That is, it is preferable that the thermal expansion rate of the adhesive 60 be reduced while maintaining its flexibility.

A description will now be given of a glass transition temperature of each of the adhesive 60 and the seal resin of the plastic package 28.

Generally, when a temperature of a material exceeds its glass transition temperature, the thermal expansion rate of the material increases more than three times. Accordingly, if an evaluation test in which a temperature exceeding the glass transition temperature of an adhesive is performed on a semiconductor device, the thermal stress generated in the adhesive is greatly increased, which greatly shortens a time period until occurrence of a failure.

An environment acceleration test is known as the evaluation test in which a temperature exceeding the glass transition temperature of the adhesive is applied. In the environment acceleration test, a semiconductor device is repeatedly subjected to a heat cycle in which the semiconductor device is maintained at −65° C. for 30 minutes, then, at a room temperature for 1 minute and subsequently at 150° C. for 30 minutes so as to investigate occurrence of a failure.

Accordingly, it is preferable that the glass transition temperatures of both the adhesive 60 and the seal resin forming the plastic package 28 be higher than 150° C. Even if the glass transition temperature of the adhesive is lower than 150° C., it is preferable that the glass transition temperature of the adhesive be as close to 150° C. as possible. In the present embodiment, since the glass transition temperature of the adhesive 60 can be increased by adding the filler 62 to the adhesive 60, a possibility of a failure can be reduced.

A description will now be give of a result of experiments performed on the semiconductor device 20E according to the present invention. In order to conduct the experiments, semiconductor devices A, B and B-improved were prepared as shown in FIG. 30. The semiconductor A was prepared as a sample in which the thermal expansion rates of the adhesive and the seal resin match each other. The semiconductor device B was prepared as a sample in which the thermal expansion rate of the adhesive is much higher than that of the seal resin. The semiconductor device B-improved was prepared as a sample in which the thermal expansion rate of the adhesive is reduced by adding the filler to the adhesive of the semiconductor device B.

In each of the semiconductor devices A, B and B-improved, the substrate 22 was formed of a polyimide tape having the thermal expansion rate of 20 [ppm/° C.] and the semiconductor chip 23 mounted on the substrate 20 was formed from a silicon wafer having the thermal expansion rate of 3.6 [ppm/° C.] as shown in FIG. 29. Accordingly, it was preferable that the thermal expansion rate of the adhesive 60 be a value between 3.6 [ppm/° C.] and 20 [ppm/° C.]. Additionally, the wiring patterns including the electrode film 25 were made of a copper plate having the thermal expansion rate of 17.7 [ppm/° C]. The solder balls 30 as external connection electrodes were formed of solder having the thermal expansion rate of 25.4 [ppm/° C.]. FIG. 29 shows the thermal expansion rates and the coefficient of elasticity of these component parts. It should be noted that the row of "mounting board" in FIG. 29 indicates an average thermal expansion rate and coefficient of elasticity.

FIG. 30 is an illustration for explaining the thermal expansion rate and the glass transition temperature of each of the semiconductor devices A, B and B-improved.

Regarding the semiconductor device A, the thermal expansion rate of the adhesive was in the range of 10 to 16 [ppm/° C.] which was between the thermal expansion rates of the substrate 22 and the semiconductor chip 23. The thermal expansion rate of the seal resin was in the range of 6 to 10 [ppm/° C.] which approximated the thermal expansion rate of the adhesive. The glass transition temperature of the adhesive provided in the semiconductor device A was in the range of 135 to 145° C. which was nearly equal to the glass transition temperature 130° C. of the seal resin. As mentioned above, the combination of the adhesive and the seal resin in the semiconductor device A satisfied the requirement of the semiconductor device 20E according to the present embodiment.

Regarding the semiconductor device B, the thermal expansion rate of the adhesive was in the range of 40 to 50 [ppm/° C.] which was considerably higher than the thermal expansion rates 20 [ppm/° C.] of the substrate 22. The thermal expansion rate of the seal resin was in the range of 12 to 16 [ppm/° C.] which was considerably lower than the thermal expansion rate of the adhesive. The glass transition temperature of the adhesive provided in the semiconductor device B was in the range of 130 to 140° C. which was considerably lower than the glass transition temperature 210° C. of the seal resin. As mentioned above, the combination of the adhesive and the seal resin in the semiconductor device B did not satisfy the requirement of the semiconductor device 20E according to the present embodiment.

The semiconductor device B-improved was prepared by using the adhesive whose thermal expansion rate was adjusted by adding the filler to the adhesive of the semiconductor device B. That is, by adding the filler to the adhesive, the thermal expansion rate of the adhesive was reduces to be in the range of 10 to 20 [ppm/° C]. Thereby, the thermal expansion rate of the adhesive was set to be a value between the thermal expansion rates of the substrate and the semiconductor chip and was approximated to the thermal expansion rate of the seal resin. Additionally, the glass transition temperature of the adhesive was slightly increased due to the addition of the filler, which temperature was closer to the glass transition temperature 210° C. of the seal resin.

Figures 31, 32:
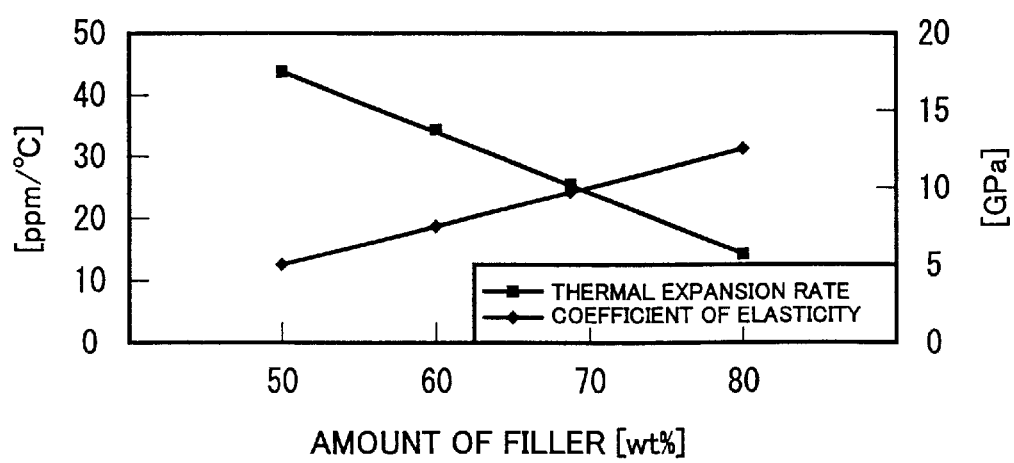
FIG. 31 is an illustration for explaining a relationship between an amount of a filler added to the adhesive of a semiconductor device and each of the thermal expansion rate and the coefficient of elasticity.
FIG. 32 is a graph showing the relationship explained with reference to FIG. 31.

FIG. 31 is an illustration for explaining a relationship between an amount of the filler added to the adhesive of the semiconductor device B and each of the thermal expansion rates and the coefficients of elasticity. FIG. 32 is a graph showing the relationship between an amount of the filler added to the adhesive of the semiconductor device B and each of the thermal expansion rates and the coefficients of elasticity. It can be appreciated from the graph of FIG. 32 that the thermal expansion rate of the adhesive decreased as the amount of the filler increased, and the thermal expansion rate of the adhesive fell in the range of 10 to 20 [ppm/° C.] which was between the thermal expansion rates of the substrate and the semiconductor chip 23 when the amount of the filler in the adhesive was 80 wt %. The increase in the coefficient of elasticity was moderate.

An environment acceleration test was performed on test samples of the semiconductor devices in the sizes of 10 mm square package and 14 mm square package with respect to each of the semiconductor devices A, B and B-improved. In the environment acceleration test, a heat cycle was repeatedly applied to each test sample and occurrence of failure was investigated for each 100 cycles. The heat cycle was such that the test sample was held at a temperature of −65° C. for 30 minutes, followed by a room temperature for 1 minute and subsequently at a temperature of 150° C. for 30 minutes.

FIG. 33 is an illustration for explaining results of the environment acceleration test. With respect the semiconductor devices formed in the 10 mm square size, the failure occurring cycle of the semiconductor device A was 1,200 cycles. That is, an open fault such as breakage of the wiring patterns was detected after the heat cycle was repeated 1,200 times. The failure occurring cycle of the semiconductor device B was 700 cycles which was less than the failure occurring cycle of the semiconductor device A. That is, the time to failure of the semiconductor device B was about one half of that of the semiconductor device A. On the other hand, the failure occurring cycle of the semiconductor device B-improved was 1,000 cycles, which was improved as compared to the failure occurring cycles of the semiconductor device B, which was 700 cycles. It was considered that the above mentioned improvement was obtained due to the effect of the thermal expansion rate of the adhesive being reduced to be a value between the thermal expansion rates of the substrate and the semiconductor chip.

Similar tests were performed on each of the semiconductor devices A, B and B-improved formed in the 14 mm square size. The results of tests were almost the same as that of the 10 mm square size, and the effect of reduction in the thermal expansion rate of the adhesive was observed.

As mentioned above, in the semiconductor device 20E according to the present embodiment, the stress generated due to the difference in thermal expansion and exerted on the wiring patterns between the substrate and the semiconductor chip can be reduced by optimizing the thermal expansion rate of the adhesive. Additionally, the stress generated in the interface between the adhesive and the seal resin can be reduced by increasing the glass transition temperature of the adhesive. Accordingly, even if the interface exists immediately above or in the vicinity of the wiring patterns, a possibility of failure such as breakage of the wiring patterns or fracture of the electrode film can be reduced, which achieves reliable mounting of the semiconductor device.

Figure 34:
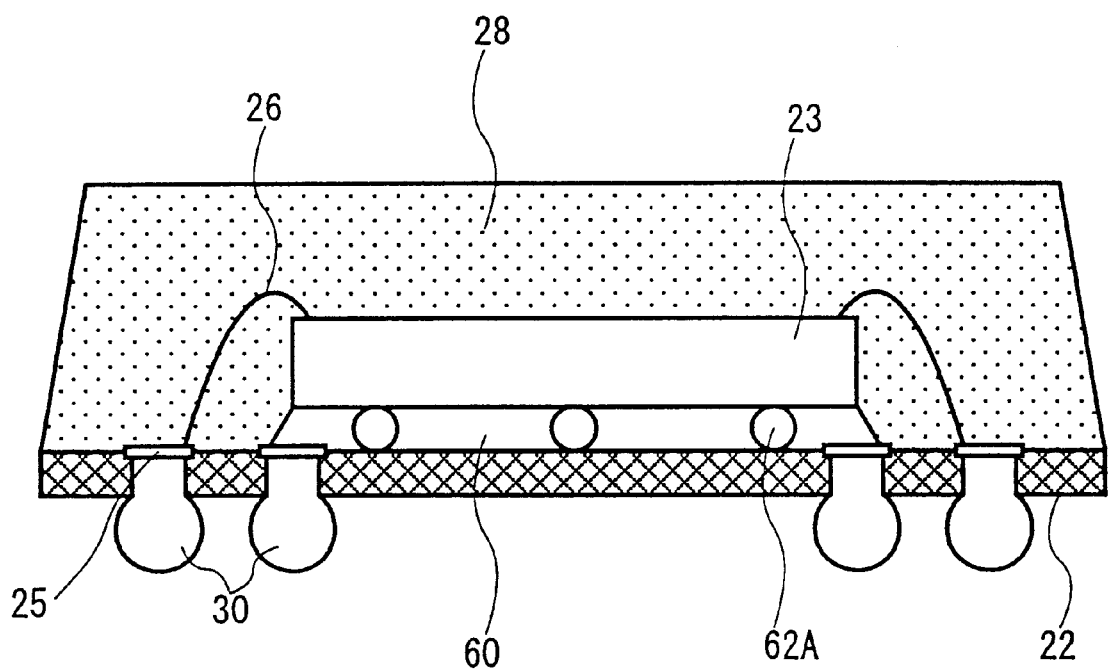
FIG. 34 is a cross-sectional view of a semiconductor device using an adhesive containing particles as spacers for forming a layer of the adhesive having a uniform thickness.

FIG. 34 is a cross-sectional view of a semiconductor device using an adhesive containing particles as spacers for forming a layer of the adhesive having a uniform thickness. In the semiconductor device shown in FIG. 34, a part of the adhesive particles 60 is replaced by particles 62A having a diameter equal to the thickness of the layer of the adhesive to be formed between the substrate 22 and the semiconductor chip 23. Thereby, the layer of the adhesive 60 can be easily formed with a uniform thickness in its entirety. According to this construction, since the layer of the adhesive has a uniform thickness, a deformation of the semiconductor device due to a thermal stress can be prevented, and breakage of the wiring patterns can also be prevented.

Figure 35:
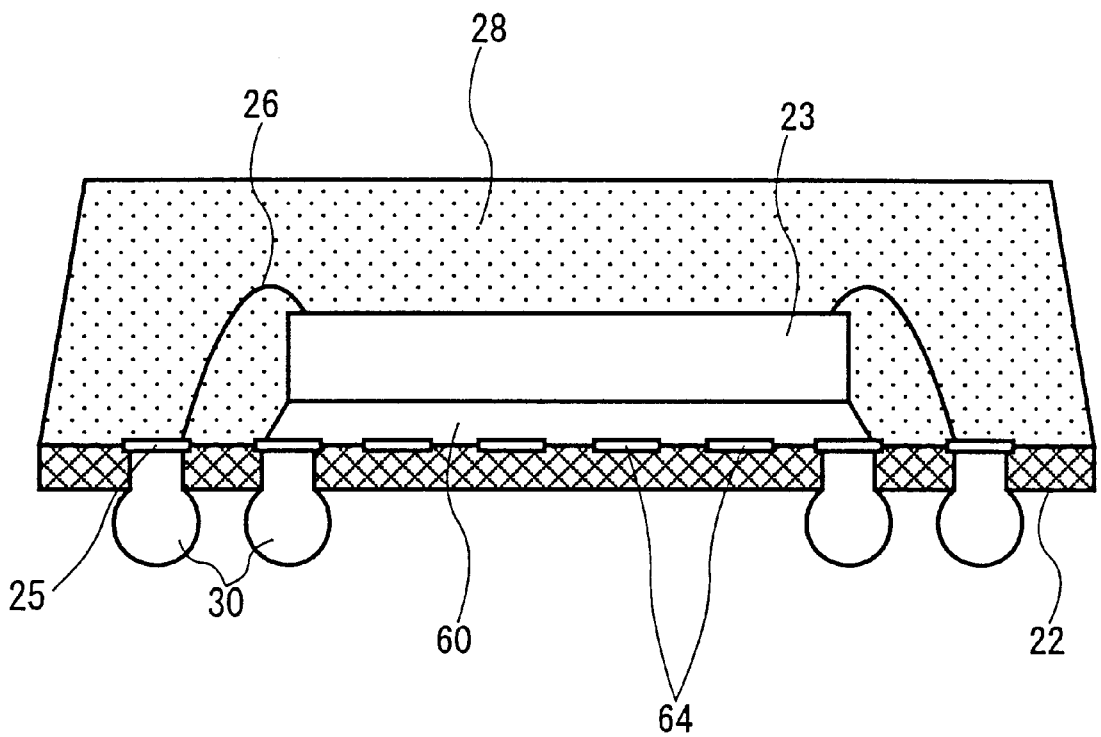
FIG. 35 is a cross-sectional view of a semiconductor device provided with dummy patterns in a semiconductor mounting area of the substrate to prevent a deformation of the semiconductor device.

FIG. 35 is a cross-sectional view of a semiconductor device provided with dummy patterns in a semiconductor mounting area of the substrate to prevent a deformation of the semiconductor device. In the semiconductor device having a structure in which the external connection electrodes (solder balls 30) are arranged along the periphery of the semiconductor device, the electrode films 25 are formed on the substrate 22 at positions corresponding to the periphery of the semiconductor chip 23. In FIG. 35, the electrode films 25 on which the solder balls are formed are arranged in two rows along the periphery of the semiconductor chip. Accordingly, there is no need to provide the electrode films 25 under the center portion of the semiconductor chip 23. However, the semiconductor device shown in FIG. 35 is provided with dummy patterns 64 having the same configuration with the electrode films 25. The dummy patterns 64 are formed in the entire area of the substrate 22 except for the area where the electrode films 25 are formed as shown in FIG. 36.

According to the above-mentioned structure, the layer of the adhesive has thinner portions where the electrode films 25 and the dummy patterns 64 are formed and thicker portions where the electrode films 25 and the dummy patterns 64 are not formed. The thinner portions and the thicker portions are regularly and alternately arranged, which substantially prevents maldistribution of the adhesive between the semiconductor chip and the substrate. Accordingly, the semiconductor device is prevented from being deformed due to ununiform thickness of the layer of the adhesive, and, thereby, the possibility of failure such as breakage of the wiring patterns can be reduced.

Figure 36:
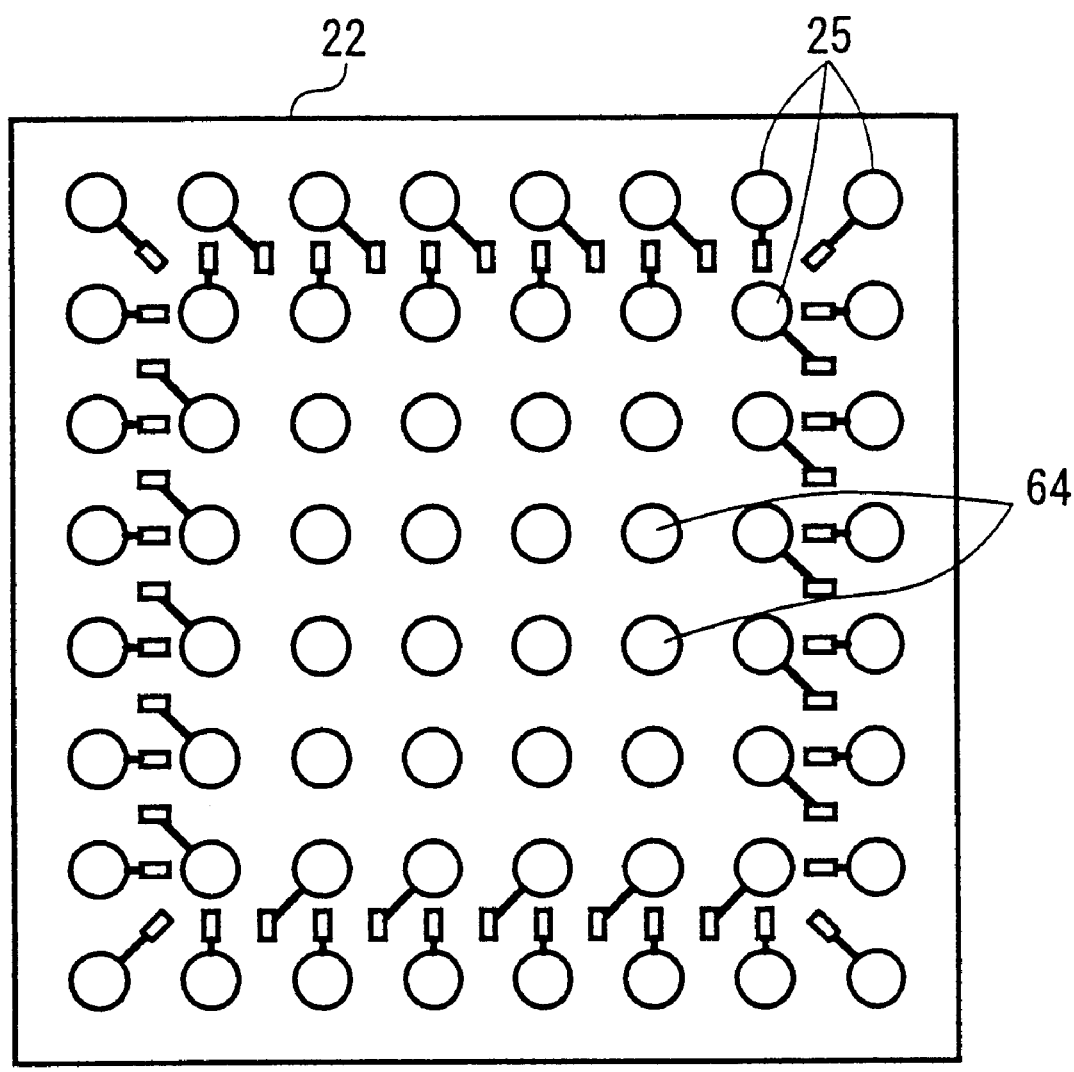
FIG. 36 is a plan view of the substrate shown in FIG. 35.

It should be noted that the dummy patterns 64 as deformation preventing patterns are not limited to the configuration and arrangement shown in FIG. 36, and any configuration and arrangement may be used as long as the maldistribution of the adhesive can be substantially eliminated. Additionally, the dummy patterns 64 may be formed together with the electrode films 25 in the same process, or formed in a different process.

The present invention is not limited to the specifically disclosed embodiments, and variations and modifications may be made without departing from the scope of the present invention.

The present application is based on Japanese priority applications No. 11-84591 filed on Mar. 26, 1999 and No. 2000-65536 filed on Mar. 9, 2000.

What is claimed is:

1. A semiconductor device comprising:
   a tape substrate having a first surface and a second surface opposite to the first surface;
   a semiconductor chip mounted on the first surface of said tape substrate;
   a plurality of electrode films formed on the first surface of said tape substrate, each of the electrode films electrically connected to said semiconductor chip; and
   a plurality of external connection electrodes provided on the second surface of said tape substrate, each of the external connection electrodes connected to a respective one of said electrode films via a through hole formed in said tape substrate,
   wherein said external connection electrodes are formed on said electrode films by plating, and a diameter S1 of a portion of each of said external connection electrodes protruding from the second surface of the tape substrate and a diameter S2 of said through hole satisfy a relationship $S1 \leq S2$.

2. The semiconductor device as claimed in claim 1, wherein said external connection electrodes are formed of a material selected from a group consisting of nickel, copper and gold.

3. A semiconductor device comprising:
   a tape substrate having a first surface and a second surface opposite to the first surface;
   a semiconductor chip mounted on the first surface of said tape substrate;
   a plurality of electrode films formed on the first surface of said tape substrate, each of the electrode films electrically connected to said semiconductor chip; and a plurality of external connection electrodes provided on the second surface of said tape substrate, each of the external connection electrodes connected to a respective one of said electrode films via a through hole formed in said tape substrate, wherein each of said external connection electrodes comprises:

a first electrode part formed on a respective one of said electrode films, the first electrode part having a height smaller than a depth of said through hole and larger than a half of the depth of said through hole; and a second electrode part connected to said first electrode part within said through hole and having a portion protruding from said through hole.

4. The semiconductor device as claimed in claim 3, wherein said external connection electrodes are formed of a material selected from a group consisting of nickel, copper and gold.

5. A semiconductor device comprising:

a tape substrate having a first surface and a second surface opposite to the first surface;

a semiconductor chip mounted on the first surface of said tape substrate;

a plurality of electrode films formed on the first surface of said tape substrate, each of the electrode films electrically connected to said semiconductor chip; and a plurality of external connection electrodes provided on the second surface of said tape substrate, each of the external connection electrodes connected to a respective one of said electrode films via a through hole formed in said tape substrate, wherein a thin film is formed on an inner surface of said through hole, and the thin film is bondable to a material forming said external connection electrodes.

6. The semiconductor device as claimed in claim 5, wherein said thin film is formed by plating a metal selected from a group consisting of nickel, copper and gold.

7. A semiconductor device comprising:

a tape substrate having a first surface and a second surface opposite to the first surface;

a semiconductor chip mounted on the first surface of said tape substrate;

a plurality of electrode films formed on the first surface of said tape substrate, each of the electrode films electrically connected to said semiconductor chip; and a plurality of external connection electrodes provided on the second surface of said tape substrate, each of the external connection electrodes connected to a respective one of said electrode films via a through hole formed in said tape substrate, wherein a ratio (B/A) of a thickness B of said tape substrate to a diameter A of said through hole is equal to or smaller than 0.3 (B/A$\leq$0.3).

8. A semiconductor device comprising:

a tape substrate having a first surface and a second surface opposite to the first surface;

a semiconductor chip mounted on the first surface of said tape substrate;

an adhesive fixing said semiconductor chip to the first surface of said tape substrate;

a plurality of electrode films formed on the first surface of said tape substrate, each of the electrode films electrically connected to said semiconductor chip; and a plurality of external connection electrodes provided on the second surface of said tape substrate, each of the external connection electrodes connected to a respective one of said electrode films via a through hole formed in said tape substrate, wherein a thickness of said adhesive between the first surface of said tape substrate and said semiconductor chip is in the range of 100 $\mu$m to 150 $\mu$m.

9. The semiconductor device as claimed in claim 8, wherein a height T of a side surface of said semiconductor chip and a height t of a filet formed by said adhesive on a periphery of said semiconductor device from a lower end of the side surface of said semiconductor chip satisfy a relationship $(0.2 \times T) \leq t < (0.6 \times T)$.

10. The semiconductor device as claimed in claim 8, wherein said adhesive has a viscosity ranging from 30,000 cps to 70,000 cps and a thixotropy index ranging from 1.0 to 4.0.

11. The semiconductor device as claimed in claim 8, wherein said adhesive has a coefficient of elasticity ranging from 200 kgf/mm$^2$ to 800 kgf/mm$^2$.

12. The semiconductor device as claimed in claim 8, wherein said adhesive has a thermal expansion rate ranging from $6 \times 10^{-6}$/° C. to $15 \times 10^{-6}$/° C.

13. The semiconductor device as claimed in claim 8, further comprising a deformation preventing pattern formed on the first surface of said tape substrate so as to prevent a deformation of said tape substrate, the deformation preventing pattern being provided in an area of said tape substrate other than an area where the electrode films are formed.

14. A semiconductor device comprising:

a substrate;

a semiconductor chip mounted on said substrate;

an adhesive fixing said semiconductor chip to said substrate;

a plurality of electrode films formed on said substrate, each of the electrode films electrically connected to said semiconductor chip; and a seal resin sealing said semiconductor chip and said electrode films, wherein a thermal expansion rate of said adhesive is greater than a thermal expansion rate of said semiconductor chip and smaller than a thermal expansion rate of said substrate, and the thermal expansion rate of said adhesive is approximated to a thermal expansion rate of said seal resin.

15. The semiconductor device as claimed in claim 14, wherein said adhesive contains a filler to adjust at least one of the thermal expansion rate and a glass transition temperature thereof by varying an amount of filler added to said adhesive.

16. The semiconductor device as claimed in claim 15, wherein the amount of said filler added to said adhesive is adjusted in the predetermined range so that the thermal expansion rate of said adhesive is increased but a coefficient of elasticity of said adhesive is maintained substantially unchanged.

17. The semiconductor device as claimed in claim 14, further comprising a deformation preventing pattern formed on said substrate so as to prevent a deformation of said substrate, the deformation preventing pattern being provided in an area of said substrate other than an area where the electrode films are formed.

18. The semiconductor device as claimed in claim 14, wherein said filler included particles having a particle diameter equal to a distance between said substrate and said semiconductor chip.

* * * * *